United States Patent
Maejima

(10) Patent No.: US 9,941,013 B2
(45) Date of Patent: Apr. 10, 2018

(54) MEMORY DEVICE THAT PERFORMS SENSING OPERATION DURING A BIT LINE PRE-CHARGE OPERATION TO DETERMINE ADJUSTMENT TO THE BIT LINE CHARGING VOLTAGE

(71) Applicant: TOSHIBA MEMORY CORPORATION, Tokyo (JP)

(72) Inventor: Hiroshi Maejima, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/280,589

(22) Filed: Sep. 29, 2016

(65) Prior Publication Data

US 2017/0271023 A1    Sep. 21, 2017

(30) Foreign Application Priority Data

Mar. 15, 2016 (JP) .................................. 2016-051465

(51) Int. Cl.
| | |
|---|---|
| G11C 16/04 | (2006.01) |
| G11C 16/28 | (2006.01) |
| G11C 16/24 | (2006.01) |
| G11C 16/34 | (2006.01) |

(52) U.S. Cl.
CPC ............. *G11C 16/28* (2013.01); *G11C 16/24* (2013.01); *G11C 16/3436* (2013.01)

(58) Field of Classification Search
CPC ......... G11C 16/28; G11C 16/26; G11C 16/24; G11C 16/3436
USPC .......................... 365/185.22, 185.17, 185.21
See application file for complete search history.

(56) References Cited

U.S. PATENT DOCUMENTS

| | | | |
|---|---|---|---|
| 8,107,292 B2 | 1/2012 | Maejima | |
| 8,551,838 B2 | 10/2013 | Kito et al. | |
| 8,649,223 B2 | 2/2014 | Maeda | |
| 2002/0126531 A1* | 9/2002 | Hosono | G11C 11/5621 365/185.17 |
| 2013/0336071 A1* | 12/2013 | Kwon | G11C 16/10 365/185.22 |
| 2014/0203345 A1* | 7/2014 | Shinagawa | G11C 16/0483 257/321 |
| 2014/0211568 A1* | 7/2014 | Mui | G11C 11/5642 365/185.21 |

FOREIGN PATENT DOCUMENTS

JP    2007266143 A    10/2007

* cited by examiner

*Primary Examiner* — Connie Yoha
(74) *Attorney, Agent, or Firm* — Patterson & Sheridan, LLP

(57) ABSTRACT

A memory device includes memory cells, word lines that are each connected to gates of a plurality of the memory cells, bit lines that are each connected to a plurality of the memory cells, and a control circuit configured to perform a determination operation on the memory cells. During the determination operation for a first memory cell among the memory cells, a first bit line connected to the first memory cell is charged using a bit line charge voltage, and the bit line charge voltage is adjusted based on a result of a first sensing operation that is performed on the first bit line. A second sensing operation is performed on the first bit line after the first sensing operation to determine whether a threshold voltage of the first memory cell is greater than a reference voltage.

19 Claims, 15 Drawing Sheets

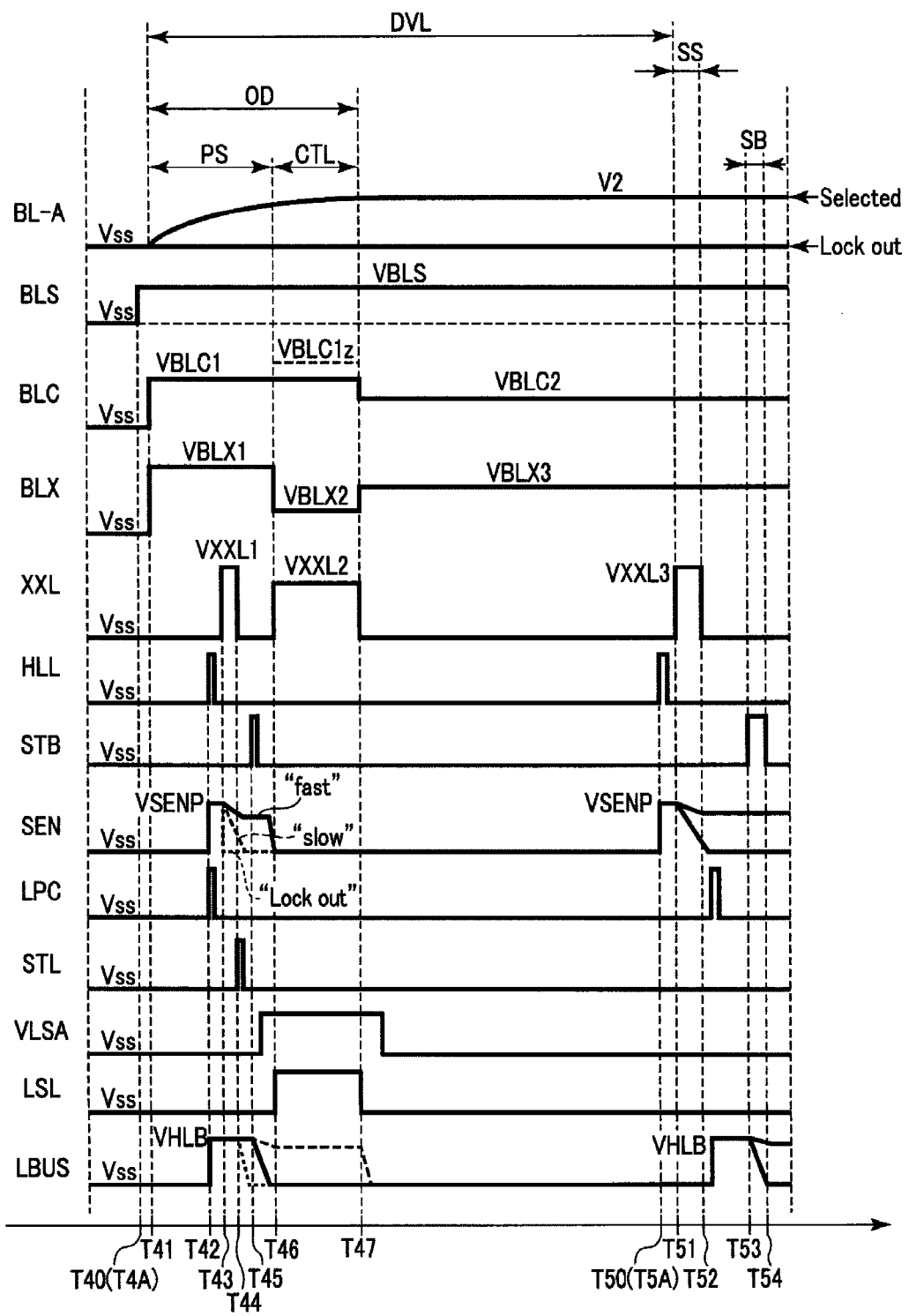

MEMORY DEVICE THAT PERFORMS SENSING OPERATION DURING A BIT LINE PRE-CHARGE OPERATION TO DETERMINE ADJUSTMENT TO THE BIT LINE CHARGING VOLTAGE

CROSS-REFERENCE TO RELATED APPLICATION

This application is based upon and claims the benefit of priority from Japanese Patent Application No. 2016-051465, filed Mar. 15, 2016, the entire contents of which are incorporated herein by reference.

FIELD

Embodiments described herein relate generally to a memory device.

BACKGROUND

A NAND flash memory is used in various electronic devices.

DESCRIPTION OF THE DRAWINGS

FIG. 10 is a timing chart illustrating an operation example of the memory device according to the embodiment.

DETAILED DESCRIPTION

Figure 1:
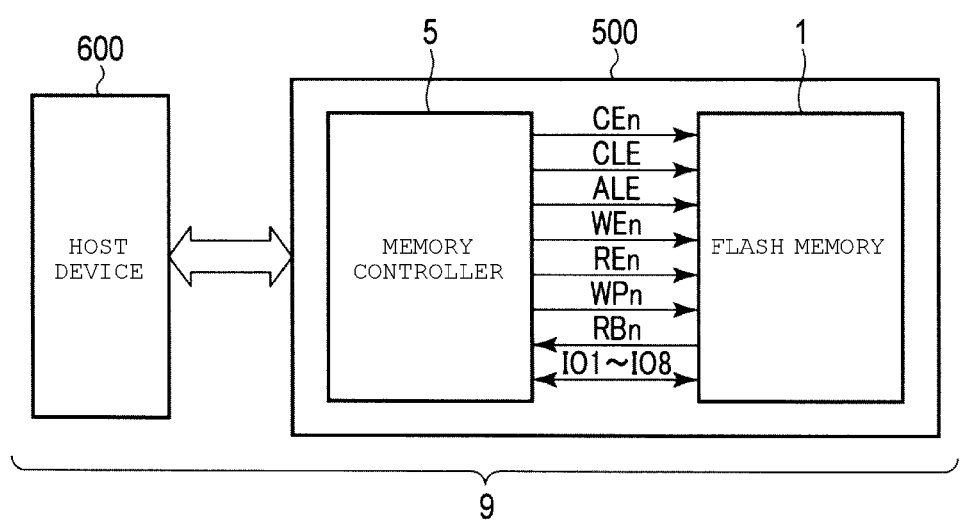
FIG. 1 is a block diagram illustrating a memory system including a memory device according to an embodiment.

According to an embodiment, characteristics of a memory device are improved.

In general, according to an embodiment, a memory device includes memory cells, word lines that are each connected to a plurality of memory cells, bit lines that are each connected to a plurality of the memory cells, and a control circuit that performs a determination operation on the memory cells.

A memory device includes memory cells, word lines that are each connected to gates of a plurality of the memory cells, bit lines that are each connected to a plurality of the memory cells, and a control circuit configured to perform a determination operation on the memory cells. During the determination operation for a first memory cell among the memory cells, a first bit line connected to the first memory cell is charged using a bit line charge voltage, and the bit line charge voltage is adjusted based on a result of a first sensing operation that is performed on the first bit line. A second sensing operation is performed on the first bit line after the first sensing operation to determine whether a threshold voltage of the first memory cell is greater than a reference voltage.

Hereinafter, embodiments will be described with reference to the drawings in detail. In the following description, common reference numerals are given to elements having the same function and configuration.

In addition, in the following embodiments, when reference numerals for certain elements (for example, a word line WL, a bit line BL, various voltages and signals, and the like) have numbers or English letters added to an end thereof to distinguish one from others of the same group, if the elements are not distinguished from each other, reference numerals are used with the numbers or English letters omitted from the end thereof.

EMBODIMENT

A memory device according to embodiments will be described with reference to FIGS. 1 to 13.

1. CONFIGURATION

A configuration example of the memory device according to the embodiment will be described with reference to FIGS. 1 to 5.

As illustrated in FIG. 1, a memory system 9 including a memory device according to the embodiment includes a storage device 500 and a host device 600.

The host device 600 is, for example, coupled to the storage device 500 by a connector, a cable, wireless communication, an Internet, and the like.

The host device 600 requests writing of data, reading of the data, and erasing of data to the storage device 500.

The storage device 500 includes a memory controller 5 and a memory device (e.g., semiconductor memory) 1.

The memory controller 5 causes the memory device 1 to execute an operation in response to the request of the host device 600.

The memory controller 5 includes, for example, a CPU (more generally, a processor), a DRAM, an SRAM, an ECC circuit, and the like. The CPU controls the entire operation of the memory controller 5. The DRAM and the SRAM temporarily retain data, programs (software or firmware), and management information (management table) of the storage device or memory device. The ECC circuit detects errors in the data read from the memory device 1 and corrects the detected errors.

The memory device 1 stores the data. The memory device 1 executes writing of the data, reading of the data, and erasing of the data based on an instruction (request of the host device 600) from the controller 5.

The memory device 1 is, for example, a NAND type flash memory. For example, the storage device 500 (or the memory system 9) including the flash memory 1 is a memory card (for example, an SD™ card or an eMMC™), a USB memory, a solid state drive (SSD), and the like.

Various signals communicate with each other between the NAND type flash memory 1 and the memory controller 5.

For example, control signals based on an NAND interface standard between the flash memory 1 and the memory controller 5, such as a chip enable signal CEn, a command latch enable signal CLE, an address latch enable signal ALE, a write enable signal WEn, a read enable signal REn, a write protect signal WPn, and the like, are used. The signal CEn causes the flash memory 1 to be enabled. Each of the signal CLE and the signal ALE notifies that command signals and address signals, respectively, are on input and output lines IO (IO1 to IO8). Each of the signal WEn and the signal REn instructs, for example, an input and an output of signals, respectively, via eight input and output lines IO. The signal Wpn causes the flash memory 1 to be a protected state, for example, when power supply is turned on or turned off. A ready or busy signal RBn is generated, and is transmitted to the controller 5 based on an operation state of the flash memory 1. The signal RBn notifies whether the flash memory 1 is in a ready state (state in which a command may be received from the controller 5) or a busy state (state in which a command may not be received from the controller 5) to the controller 5.

For example, the signal RBn is in an "L" level (busy state) when the flash memory 1 is operated such as reading and writing of data, and when the operations are completed, the signal RBn is in an "H" level (ready state).

Figure 2:
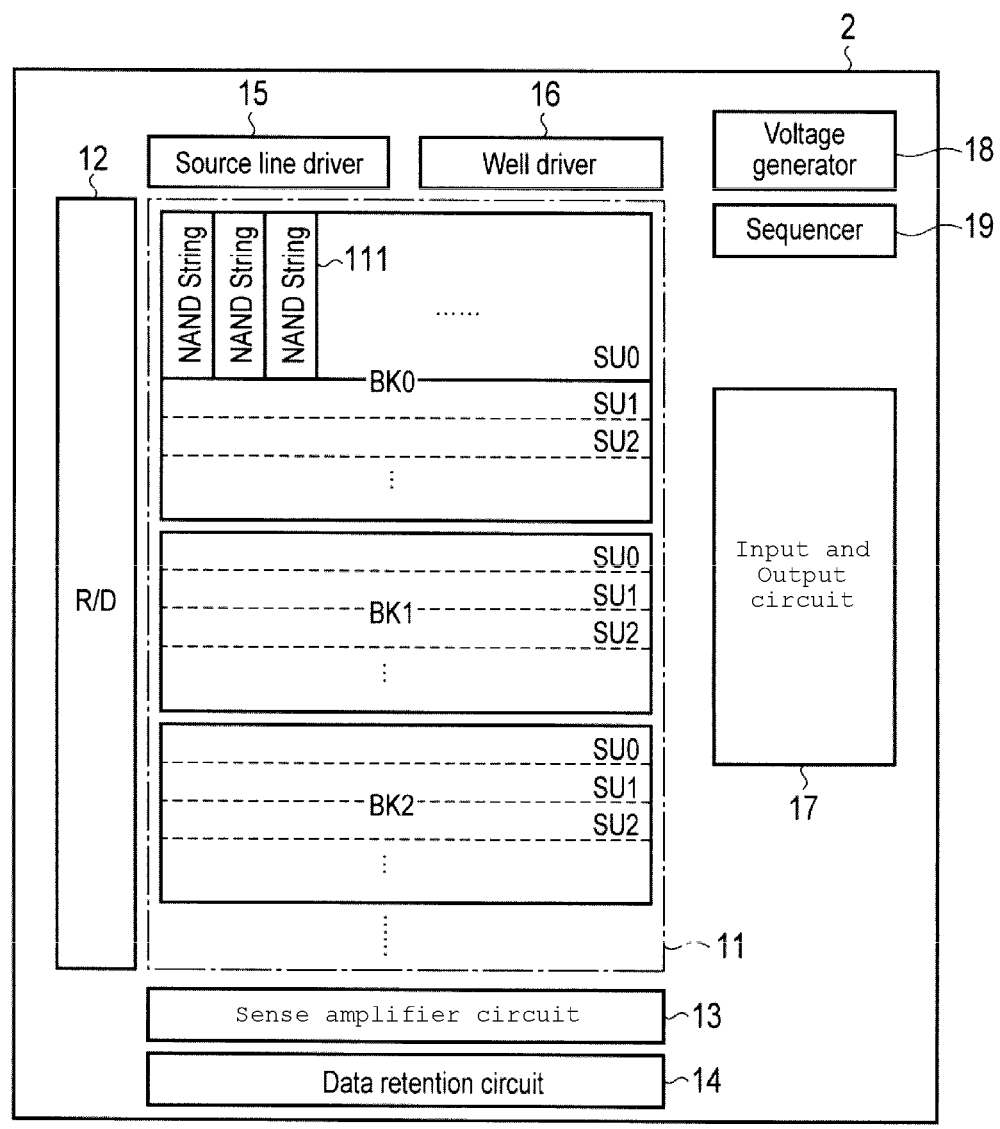
FIG. 2 is a block diagram illustrating an example of an internal configuration of the memory device according to the embodiment.

As illustrated in FIG. 2, the NAND type flash memory 1 includes a memory cell array 11, a row control circuit 12, a sense amplifier circuit 13, a data retention circuit 14, a source line driver 15, a well driver 16, an input and output circuit 17, a voltage generator 18, a sequencer 19, and the like.

The memory cell array 11 includes a plurality of blocks BK (BK0, BK1, BK2, . . . ). Each block BK includes a plurality of NAND strings (memory cell strings) 111. The NAND string 111 includes a plurality of memory cells.

An internal structure of the memory cell array 11 will be described later.

The row control circuit 12 controls rows (for example, word lines) of the memory cell array 11.

The sense amplifier circuit 13 senses and amplifies a signal (data) output to a bit line in the memory cell array 11 during reading of the data. For example, the sense amplifier circuit 13 senses generation of a current in the bit line (or wiring connected to the bit line) or a change in a potential of the bit line (or wiring connected to the bit line) as a signal from a memory cell MC. Through such sensing, the sense amplifier circuit 13 reads data held in the memory cell MC. In addition, the sense amplifier circuit 13 controls the potential of the bit line in response to a signal corresponding to writing data during writing of the data.

The data retention circuit (for example, page buffer circuit) 14 temporarily retains data output from the memory cell array 11 and data (data from the memory controller 5) input into the memory cell array 11.

The source line driver 15 controls a potential of a source line in the memory cell array 11. The well driver 16 controls a potential of a well region in the memory cell array 11.

The input and output circuit 17 functions as an interface circuit of various control signals from the controller 5 and signals on the input and output lines IO1 to IO8.

The voltage generator 18 generates various voltages used in the operation of the memory cell array 11.

The sequencer 19 controls the entire operation of the flash memory 1. The sequencer 19 controls an internal operation of the flash memory 1 based on a control signal and a command that are communicated between the memory controller 5 and the flash memory 1.

Configuration of Three Dimensional Structure Memory Cell Array

An example of an internal configuration of a memory cell array in the flash memory according to the embodiment will be described with reference to FIGS. 3 and 4.

The flash memory 1 according to the embodiment includes the memory cell array 11 having a three dimensional structure.

Figure 3:
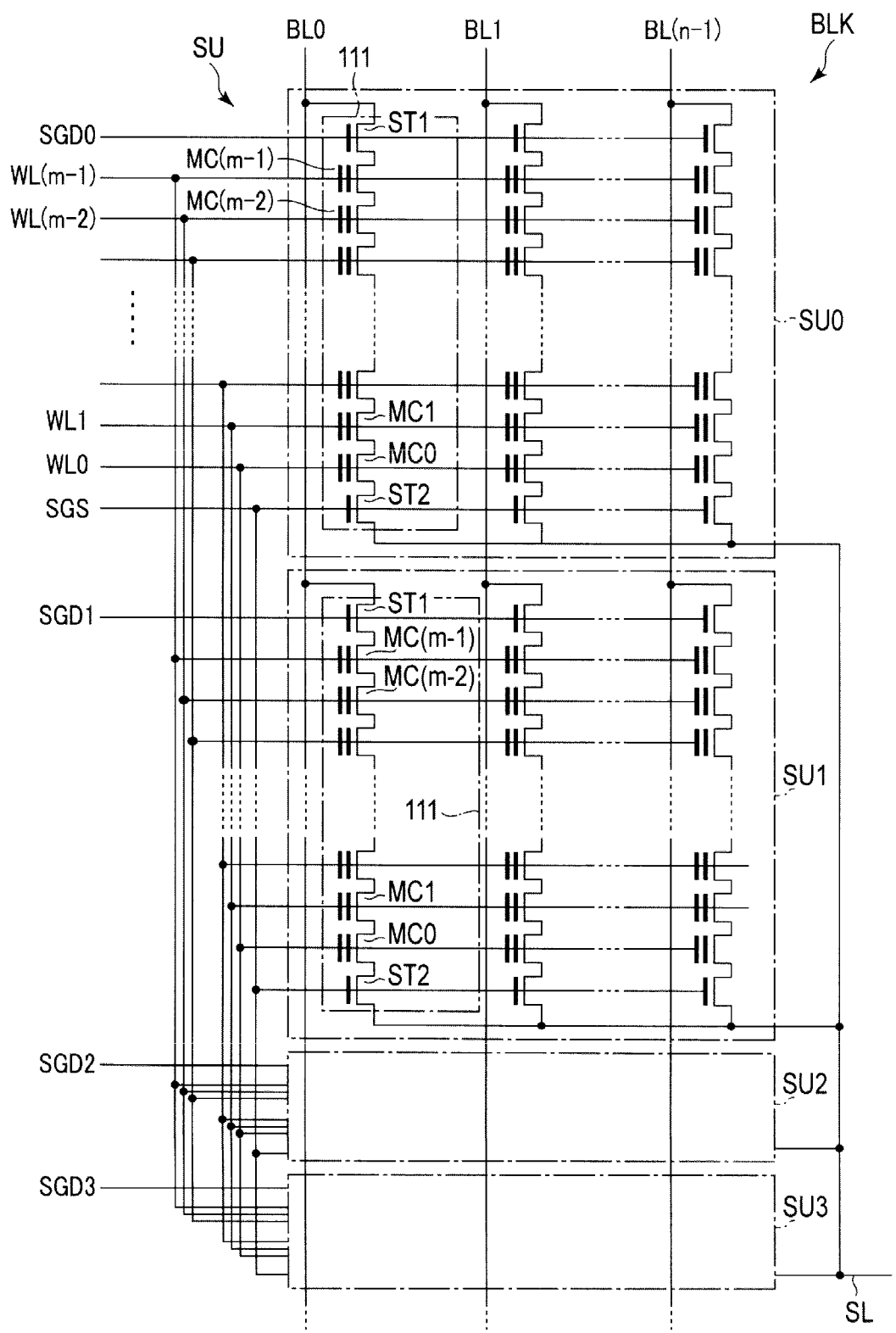
FIG. 3 is a diagram illustrating an example of an internal configuration of a memory cell array of the memory device according to the embodiment.

FIG. 3 is an equivalent circuit diagram of one block in the memory cell array 11 of the three dimensional structure. In the memory cell array 11 of the NAND type flash memory, the block BLK is an erasing unit of data. However, an erasing operation for the memory cell array 11 may be performed for a unit of storage region smaller than the block. The erasing operation of the flash memory is described in "NON-VOLATILE SEMICONDUCTOR STORAGE DEVICE AND METHOD OF MANUFACTURING THE SAME" of U.S. patent application Ser. No. 12/679,991, filed Mar. 25, 2010 and "SEMICONDUCTOR MEMORY AND METHOD FOR MANUFACTURING SAME" of U.S. patent application Ser. No. 12/532,030, filed Mar. 23, 2009, both of which are incorporated by reference herein in their entirety.

As an example illustrated in FIG. 3, in the memory cell array 11 having the three dimensional structure, one block BLK includes a plurality of (for example, four) string units SU (SU0, SU1, SU2, . . . ).

The plurality of string units SU includes a plurality of NAND strings (memory cell strings) 111.

The NAND string 111 includes a plurality of memory cells (also referred to as memory units or memory elements) MC and select transistors ST1 and ST2.

The memory cell MC (MC0, MC1, . . . , MC(m−2), and MC (m−1)) includes a control gate and a charge storage layer (memory film). In the NAND string 111, the plurality of memory cells MC are connected in series between two select transistors ST1 and ST2. One end (one of source and drain) of a drain-side memory cell MC among the plurality of memory cells MC connected in series is connected to one end of a drain-side select transistor ST1. One end of a source-side memory cell MC among the plurality of memory cells MC connected in series is connected to one end of a source-side select transistor ST2.

A plurality of word lines WL (WL0, WL1, . . . , WL(m−2), and WL(m−1)) are respectively connected to the gate of a corresponding memory cell MC, where "m" is a natural number of 2 or more. For example, one word line WL is connected in common to the memory cells MC across the plurality of string units SU.

Writing of the data and reading of the data are performed collectively for the memory cells MC connected to any one word line WL in any one string unit SU. The unit of writing of the data and reading of the data is referred to as "page".

A plurality of drain-side select gate lines SGD (SGD0 to SGD3) are respectively connected to the gate of the drain-side select transistors ST1 of corresponding string units SU.

A plurality of source-side select gate lines SGS (SGS0 to SGS3) are respectively connected to the gate of the source-side select transistors ST2 of corresponding string units SU.

A source line SL is connected to the other end (the other of source and drain) of the source side select transistor ST2.

The other end of the drain-side select transistor ST1 is connected to one bit line BL of a plurality of bit lines (BL0, BL1, . . . , and BL(n−1)). In addition, "n" is a natural number of 1 or more.

The number of the blocks BLK in the memory cell array 11, the number of the string units SU in one block BLK, and the number of the memory cells MC in the NAND string 111 are arbitrarily determined.

Figure 4:
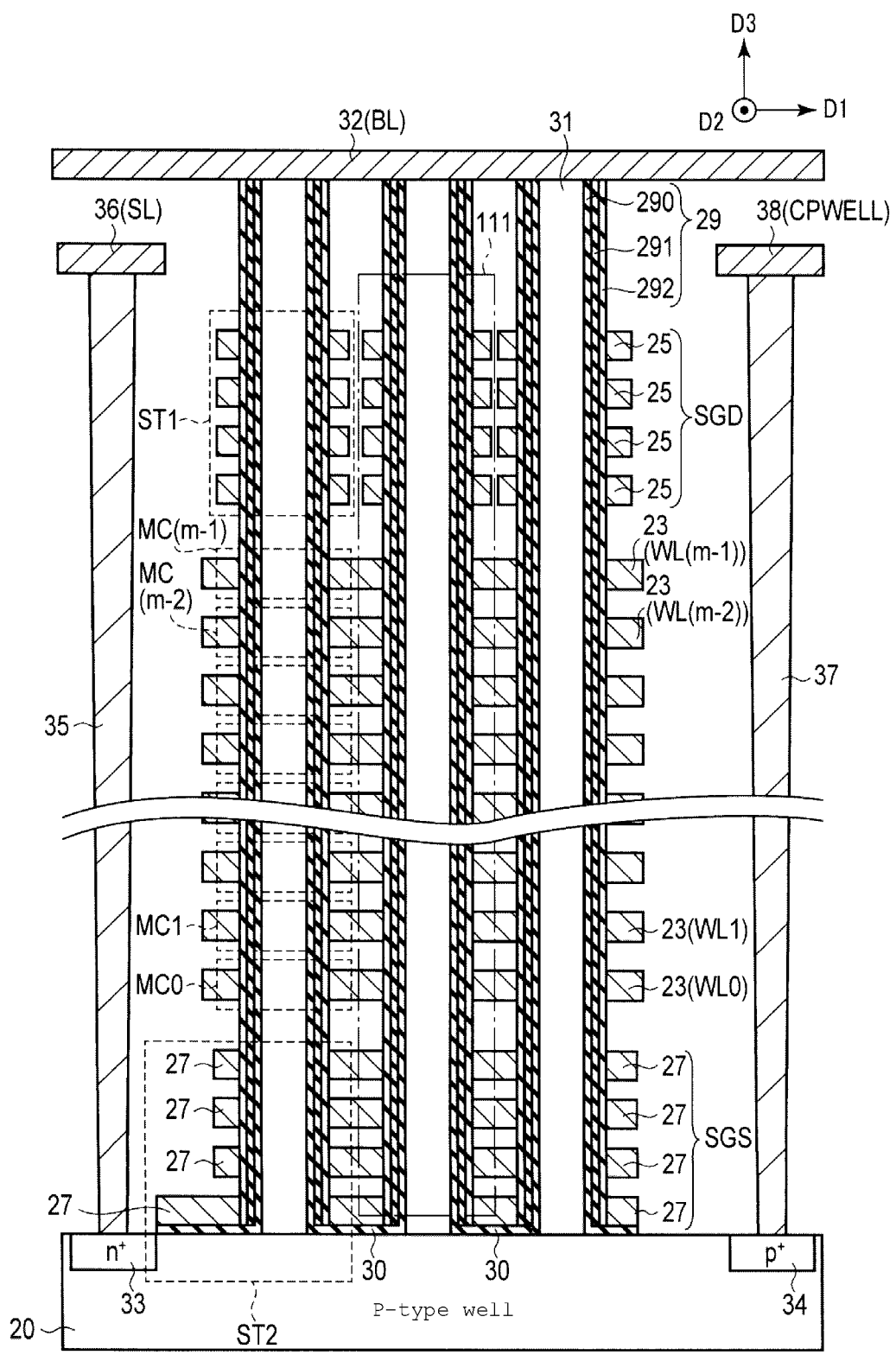
FIG. 4 is a sectional view illustrating a structure example of the memory cell array of the memory device according to the embodiment.

In the figure illustrating a schematic sectional structure of the memory cell array 11 in FIG. 4, for the sake of simplification of illustration, three NAND strings are illustrated.

As illustrated in FIG. 4, the plurality of NAND strings 111 are provided on a p-type well region 20 in a semiconductor region (for example, Si substrate).

A semiconductor pillar 31 is provided on the p-type well region 20. The semiconductor pillar 31 extends in a D3 direction (perpendicular to a front surface of the well region 20 (substrate)). The semiconductor pillar 31 functions as a current path of the NAND string 111. The semiconductor pillar 31 is a region in which channels of the memory cell MC and the select transistors ST are formed during operations of the memory cell MC and the select transistors ST1 and ST2.

A memory film 29 is provided on a side surface of the semiconductor pillar 31. A gate insulating film 290, a charge storage layer (insulating film) 291, and a block insulating film 292 are provided in the memory film 29 in order from the semiconductor pillar 31 side.

A plurality of conductive layers 23, 25, and 27 are stacked on the well region 20 via an inter-layer insulating film (not illustrated). Each of the conductive layers 23, 25, and 27 is provided on a side surface of the semiconductor pillar 31 via a memory film. Each of the conductive layers 23, 25, and 27 extends in a D2 direction.

A plurality of conductive layers 23 respectively function as the word line WL.

A plurality (four in the example) of conductive layers 25 are connected to the same drain-side select gate line SGD in each NAND string 111. Four conductive layers 25 substantially function as a gate electrode of one select transistor ST1.

A plurality (four in the example) of conductive layers 27 are connected to the same source-side select gate line SGS. Four conductive layers 27 substantially function as a gate electrode of one select transistor ST2. The conductive layers (source-side select gate lines) 27 in the same string unit SU are connected in common to each other.

A conductive layer 32 that functions as a bit line BL is provided above an upper end of the semiconductor pillar 31. The bit line BL is electrically connected to the semiconductor pillar 31 via a plug (not illustrated). The conductive layer 32 extends in a D1 direction.

An n$^+$-type impurity diffusion layer 33 and a p$^+$-type impurity diffusion layer 34 are provided in a surface region of the well region 20.

A contact plug 35 is provided on the diffusion layer 33. A conductive layer 36 is provided on the contact plug 35. The conductive layer 36 functions as the source line SL. A gate insulating film 30 is formed on the well region 20 between adjacent NAND strings 111. The conductive layer 27 and the gate insulating film 30 extend to the vicinity of the diffusion layer 33. Therefore, when the select transistor ST2 is in a state of being turned on, the channel of the select transistor ST2 electrically connects the memory cell MC and the diffusion layer 33.

A contact plug 37 is provided on the diffusion layer 34. A conductive layer 38 is provided on the contact plug 37. The conductive layer 38 functions as a well wiring CPWELL. A voltage is applied to the well wiring CPWELL, whereby a potential can be applied to the semiconductor pillar 31.

As described above, in each NAND string 111, the select transistor ST2, the plurality of memory cells MC, and the select transistor ST1 are stacked on the well region 20 in order.

The plurality of NAND strings 111 are arranged in the D2 direction. Each string unit SU is a set of the plurality of NAND strings 111 arranged in the D2 direction.

A charge is injected into the memory film 29, whereby a threshold voltage of the memory cell MC is changed. Data is written to the memory cell by using the change in the threshold voltage of the memory cell MC. In one embodiment, the memory cell MC is capable of storing data equal to or greater than one bit.

Figure 5:
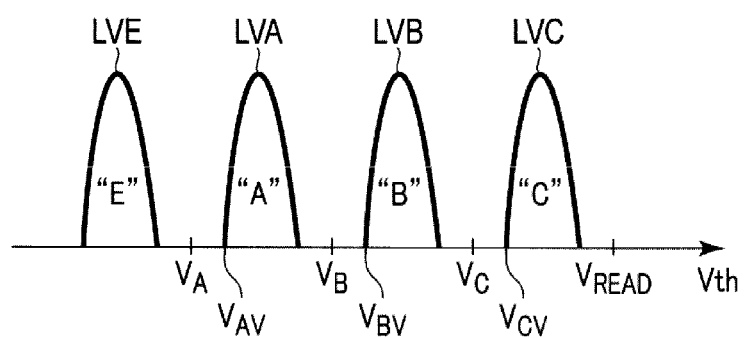
FIG. 5 is a diagram describing a data retention state of the memory device according to the embodiment.

As illustrated in FIG. 5, when the memory cell MC stores data of two bits ("11", "10", "01", and "00"), for distribution (hereinafter, referred to as threshold voltage distribution) of the threshold voltage of the memory cell MC, four threshold voltage distributions (also referred to as level or state) LVE, LVA, LVB, and LVC are set so as to correspond to the data of two bits (four values).

The threshold voltage of the memory cell MC belongs to any one of the threshold voltage distributions LVE, LVA, LVB, and LVC of an E level, an A level, a B level, and a C level, respectively. Through this technique, the memory cell MC stores the data of two bits.

In the following description, an A level cell is a memory cell which stores data corresponding to the A level or is a memory cell in which data corresponding to the A level is written. A B level cell is a memory cell which stores data corresponding to the B level or is a memory cell in which data corresponding to the B level is written. A C level cell is a memory cell which stores data corresponding to the C level or is a memory cell in which data corresponding to the C level is written. An E level cell is a memory cell of the E level (erasing state).

In order to determine data stored in the memory cell MC, a determination level (determination voltage) is set between the threshold voltage distributions. As a determination level (hereinafter, also referred to as a reading level) for reading data, levels $V_A$, $V_B$, and $V_C$ are used.

In order to determine whether or not the memory cell MC reaches the threshold voltage distribution corresponding to data that is to be written by the memory cell MC when writing data to the memory cell MC, a determination level for verifying is set in the vicinity of a voltage value (potential) of a lower limit of each threshold voltage distribution.

As a determination level (hereinafter, also referred to as a verifying level) for verifying, levels $V_{AV}$, $V_{BV}$, and $V_{CV}$ are used.

When the determination level is applied to the gate (word line) of the memory cell MC, it is detected whether or not the memory cell MC is turned on. Therefore, a magnitude relationship between data stored in the memory cell and the threshold voltage of the memory cell is determined.

A read pass voltage VREAD is higher than an upper limit of the highest threshold voltage distribution among a plurality of threshold voltage distributions. The memory cell MC to which the read pass voltage VREAD is applied is turned on regardless of its stored data.

The embodiments may employ a structure, an operation, and a manufacturing method of the three dimensional structure memory cell arrays described in "THREE DIMENSIONAL STACKED NONVOLATILE SEMICONDUCTOR MEMORY" of U.S. patent application Ser. No. 12/407,403, filed Mar. 19, 2009, in "THREE DIMENSIONAL STACKED NONVOLATILE SEMICONDUCTOR MEMORY" of U.S. patent application Ser. No. 12/406,524, filed Mar. 18, 2009, in "NON-VOLATILE SEMICONDUCTOR STORAGE DEVICE AND METHOD OF MANUFACTURING THE SAME" of U.S. patent application Ser. No. 12/679,991, filed Mar. 25, 2010, and in "SEMICONDUCTOR MEMORY AND METHOD FOR MANUFACTURING SAME" of U.S. patent application Ser. No. 12/532,030, filed Mar. 23, 2009, all of which patent applications are incorporated by reference herein in their entirety.
Internal Configuration Example of Sense Amplifier Circuit FIG. 6 is an equivalent circuit diagram illustrating an example of an internal configuration of the sense amplifier circuit of the flash memory according to the embodiment.

Figure 6:
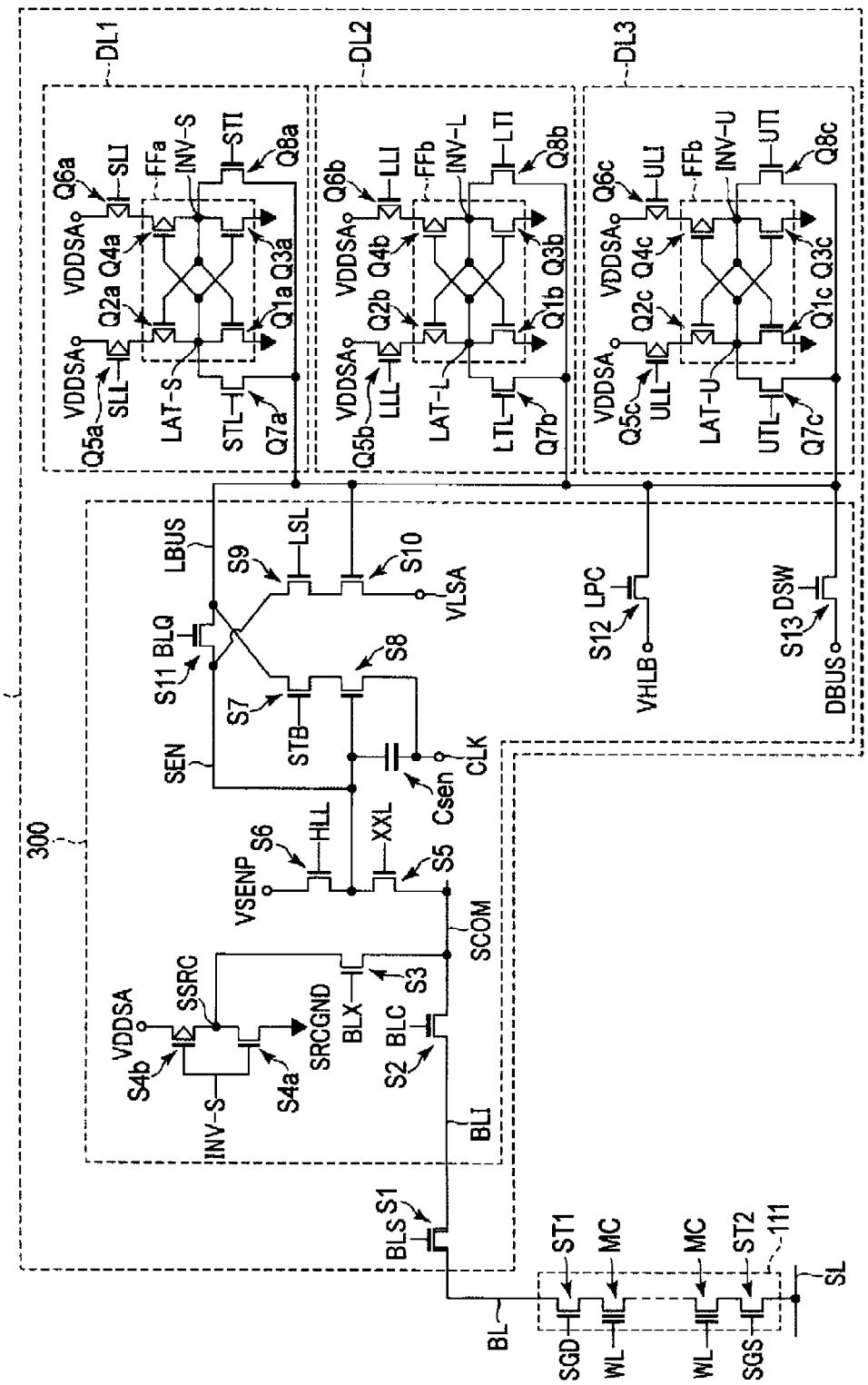
FIG. 6 is an equivalent circuit diagram illustrating an example of a circuit configuration of the memory device according to the embodiment.

As illustrated in FIG. 6, for example, the sense amplifier circuit 13 includes a plurality of sense amplifier units 131. One sense amplifier unit 131 corresponds to one bit line BL.

sense amplifier unit 131 includes a bit line control circuit 300 and one or more data latches DL (DL1, DL2, and DL3).

The bit line control circuit 300 includes a plurality of transistors (field effect transistors) S1 to S12. The bit line control circuit has a circuit configuration as follows.

An n-type transistor S1 controls activation of the bit line BL (which is connected to NAND string 111). In order to control the activation of the bit line, a control signal BLS is supplied on the gate of the transistor S1.

One end (one of source and drain) of the transistor S1 is connected to the bit line BL. The other end (the other of source and drain) of the transistor S1 is connected to a node (wiring or terminal) BL1.

In one embodiment, the transistor S1 is a high breakdown voltage transistor, which has relatively high insulating strength to transfer a relatively high voltage to the bit line BL. As a result, the transistor S1 has a relatively high threshold voltage.

An n-type transistor S2 controls the potential of the bit line BL. A control signal BLC is supplied on the gate of the transistor S2. The transistor S2 clamps the potential of the bit line BL to a potential corresponding to the control signal BLC.

One end of the transistor S2 is connected to a node BLI. The other end of the transistor S2 is connected to a node SCOM.

An n-type transistor S3 controls electrical connection between a node SSRC and the node SCOM. One end of the transistor S3 is connected to the node SCOM. The other end of the transistor S3 is connected to the node SSRC. A control signal BLX is supplied on the gate of the transistor S3.

The node SSRC is connected to one end of an n-type transistor S4a and one end of a p-type transistor S4b.

The other end of the n-type transistor S4a is connected to a node SRCGND. The other end of the p-type transistor S4b is connected to a node VDDSA.

A ground voltage (ground potential) Vss is applied to the node (ground terminal) SRCGND. A voltage (>Vss) of a certain voltage value is applied to the node (voltage terminal) VDDSA.

A control signal INV-S is applied to the gates of two transistors S4a and S4b. One of the n-type and p-type transistors S4a and S4b is turned on according to a signal level of the control signal INV-S. Therefore, one of the voltage of the node SRCGND and the voltage of the node VDDSA is supplied on the node SSRC via one of the two transistors S4a and S4b which is turned on.

An n-type transistor S5 controls connection between the node (bit line BL) SCOM and a node SEN. A control signal XXL is supplied on the gate of the transistor S5.

One end of the transistor S5 is connected to the node SCOM. The other end of the transistor S5 is connected to the node SEN.

An n-type transistor S6 controls connection between the node SEN and a node VSENP. A control signal HLL is supplied on the gate of the transistor S6. One end of the transistor S6 is connected to the node SEN and the other end of the transistor S5. The other end of the transistor S6 is connected to the node VSENP. A voltage of a certain voltage value is applied to the node VSENP.

N-type transistors S7 and S8 transfer a signal corresponding to the threshold voltage of the memory cell MC to a bus LBUS and the latch DL.

One end of the transistor S7 is connected to the bus LBUS. The other end of the transistor S7 is connected to one end of the transistor S8. The other end of the transistor S8 is connected to a node CLK. The gate of the transistor S8 is connected to the node SEN. A control signal STB is supplied on the gate of the transistor S7.

The node SEN is capacitively coupled to the node CLK. A capacitor Csen is connected between the node SEN and the node CLK. One end of the capacitor Csen is connected to the gate of the transistor S8 and the node SEN. The other end of the capacitor Csen is connected to the node CLK.

The node SEN and the capacitor Csen can retain a signal (charge) corresponding to the threshold voltage of the memory cell MC by the function of a capacitive element. The transistor S8 is turned on or turned off according to the potential of the node SEN.

When the transistors S7 and S8 are turned on, the bus LBUS in a charged state is electrically connected to the node CLK. In this case, the potential of the bus LBUS is substantially changed to the potential (for example, ground voltage) of the node CLK.

When the transistor S8 is turned on in accordance with the potential of the node SEN, even when the transistor S7 is in an ON state, the bus LBUS of the charged state is electrically isolated from the node CLK by the transistor S8 of an OFF state. In this case, the potential of the bus LBUS is barely changed and the bus LBUS maintains the charged state.

As described above, the potential of the bus LBUS is changed in accordance with the potential of the node SEN. As a result, a signal corresponding to the potential of the node SEN is transferred to the bus LBUS.

N-type transistors S9 and S10 transfer a signal held in the latch DL or the bus LBUS to the node SEN (memory cell MC).

One end of the transistor S9 is connected to the node SEN. The other end of the transistor S9 is connected to one end of the transistor S10. A control signal LSL is supplied on the gate of the transistor S9.

The other end of the transistor S10 is connected to a node VLSA. A voltage of a certain voltage value is applied to the node VLSA. The gate of the transistor S10 is connected to the bus LBUS. The transistor S10 is turned on or turned off in accordance with the potential of the bus LBUS. For example, the bus LBUS has a capacity of a certain size. Therefore, the bus LBUS can hold a charge of an amount corresponding to a signal level as a capacitive element.

When two transistors S9 and S10 are turned on, the node VLSA is electrically connected to the node SEN. Therefore, a potential of the node VLSA is supplied on the node SEN. When the transistor S10 is turned off by the potential of the bus LBUS, even when the transistor S9 is in an ON state, the node VLSA is electrically isolated from the node SEN by the transistor S10 of an OFF state.

As described above, a signal corresponding to the potential of the bus LBUS is transferred to the node SEN (bit line BL).

One end of an n-type transistor S11 is connected to the node SEN. The other end of the transistor S11 is connected to the bus LBUS. A control signal BLQ is supplied on the gate of the transistor S11. The transistor S11 is turned on or turned off according to the signal level of the control signal BLQ. When the transistor S11 is turned off, the node SEN is electrically isolated from the bus LBUS. When the transistor S11 is in an ON state, the node SEN is electrically connected to the bus LBUS.

An n-type transistor S12 controls connection between the bus LBUS and a node VHLB to charge (pre-charge) the bus LBUS.

One end of transistor S12 is connected to the bus LBUS. The other end of transistor S12 is connected to the node VHLB. A control signal LPC is supplied on the gate of transistor S12. Transistor S12 is turned on or turned off according to a signal level of the control signal LPC.

An n-type transistor S13 controls connection between the bus (local bus) LBUS and a node (data bus) DBUS to perform transfer of data between the sense amplifier circuit 13 and the data retention circuit 14.

One end of the transistor S13 is connected to the bus LBUS. The other end of the transistor S13 is connected to the node DBUS. A control signal DSW is supplied on the gate of the transistor S13. The transistor S13 is turned on or turned off according to a signal level of the control signal DSW.

In the sense amplifier unit 131, for example, three latches DL (DL1, DL2, and DL3) are connected to one bit line control circuit 300 via the bus LBUS.

The first data latch (SDL) DL1 is used, for example, as a latch that temporarily retains a signal (information) for controlling the bit lines.

The upper data latch (UDL) DL2 retains the upper bit of two bits, for example, when the memory cell MC is capable of storing data of two bits.

The lower data latch (LDL) DL3 retains the lower bit of two bits, for example, when the memory cell MC is capable of storing data of two bits.

Each latch DL has an internal configuration as follows. The latch DL includes one flip-flop FF (FFa, FFb, and FFc). The flip-flop FF includes four transistors Q1, Q2, Q3, and Q4.

In the flip-flop FF, one end of an n-type transistor Q1 (Q1a, Q1b, and Q1c) is connected to a node LAT (LAT-S, LAT-L, and LAT-U). One end of a p-type transistor Q2 (Q2a, Q2b, and Q2c) is connected to the node LAT.

The other end of the transistor Q1 is connected to a node (ground terminal) Vss. The other end of the transistor Q2 is connected to the node (volume terminal) VDDSA via a transistor Q5.

The gates of two transistors Q1 and Q2 are connected to each other.

One end of a transistor Q3 (Q3a, Q3b, and Q3c) is connected to a node INV (INV-S, INV-L, and INV-U). One end of a transistor Q4 (Q4a, Q4b, and Q4c) is connected to the node INV.

The other end of the transistor Q3 is connected to the node Vss. The other end of the transistor Q4 is connected to the node VDDSA via a transistor Q6.

The gates of two transistors Q3 and Q4 are connected to each other.

The gates of the transistors Q1 and Q2 are connected to the node INV. The gates of the transistors Q3 and Q4 are connected to the node LAT.

As described above, the flip-flop FF includes four transistors Q1, Q2, Q3, and Q4 as a substantial data retention portion of the latch DL.

The transistor Q5 (Q5a, Q5b, and Q5c) and the transistor Q6 (Q6a, Q6b, and Q6c) are, for example, p-type field effect transistors.

One end of the transistor Q5 is connected to a voltage input portion (the other end of the transistor Q2) of the flip-flop FF and the other end of the transistor Q5 is connected to the node VDDSA. One end of the transistor Q6 is connected to the voltage input portion (the other end the transistor Q4) of the flip-flop FF and the other end of the transistor Q6 is connected to the node VDDSA.

One end of an n-type transistor Q7 (Q7a, Q7b, and Q7c) is connected to the node LAT of one side within the flip-flop FF as a transfer gate. The other end of the transistor Q7 is connected to the bus LBUS.

One end of an n-type transistor Q8 (Q8a, Q8b, and Q8c) is connected to the node INV of the other side within the flip-flop FF as a transfer gate. The other end of the transistor Q8 is connected to the bus LBUS.

Each data latch DL controls electric connection between the flip-flop FF and the node VDDSA by control signals different from each other.

In the data latch DL1, a control signal SLL is supplied on the gate of the transistor Q5a and a control signal SLI is supplied on the gate of the transistor Q6a. In the data latch DL2, a control signal LLL is supplied on the gate of the transistor Q5b and a control signal LLI is supplied on the gate of the transistor Q6b. In the data latch DL3, a control signal ULL is supplied on the gate of the transistor Q5c and a control signal ULI is supplied on the gate of the transistor Q6c.

Therefore, supply of a voltage VDDSA with respect to the flip-flop FF is controlled by the control signals SLL, LLL, ULL, SLI, LLI, and ULI independent from each other with respect to the transistors Q5 and Q6.

In each data latch DL, data transfer between the data latch DL and the bus LBUS is controlled by control signals different from each other.

In the data latch DL1, a control signal STL is supplied on the gate of the transistor Q7a and a control signal STI is supplied on the gate of the transistor Q8a. In the data latch DL2, a control signal LTL is supplied on the gate of the transistor Q7b and a control signal LTI is supplied on the gate of the transistor Q8b. In the data latch DL3, a control signal UTL is supplied on the gate of the transistor Q7c and a control signal UTI is supplied on the gate of the transistor Q8c.

In each transistor Q7, connection between the node LAT and the bus LBUS is controlled by the control signals STL, LTL, and UTL independent from each other. In each transistor Q8, connection between the node INV and the bus LBUS is controlled by the control signals STI, LTI and UTI independent from each other.

The potential of a node INV-S within the data latch DL1 is applied to the gate of the transistors S4a and S4b via wiring (not illustrated) as a control signal with respect to the transistors S4a and S4b. Therefore, a voltage output to the node SSRC is controlled.

2. OPERATION EXAMPLE

An operation example (control method) of the embodiment will be described with reference to FIGS. 7 to 13. Hereinafter, the operation example of the memory device according to the embodiment will be described with reference to FIGS. 1 to 6 appropriately in addition to FIGS. 7 to 13.

2-1. Basic Operation

In the embodiment, writing (writing sequence) of data of the flash memory according to the embodiment will be described.

Writing data in the flash memory includes one or more write loops.

Figure 7:
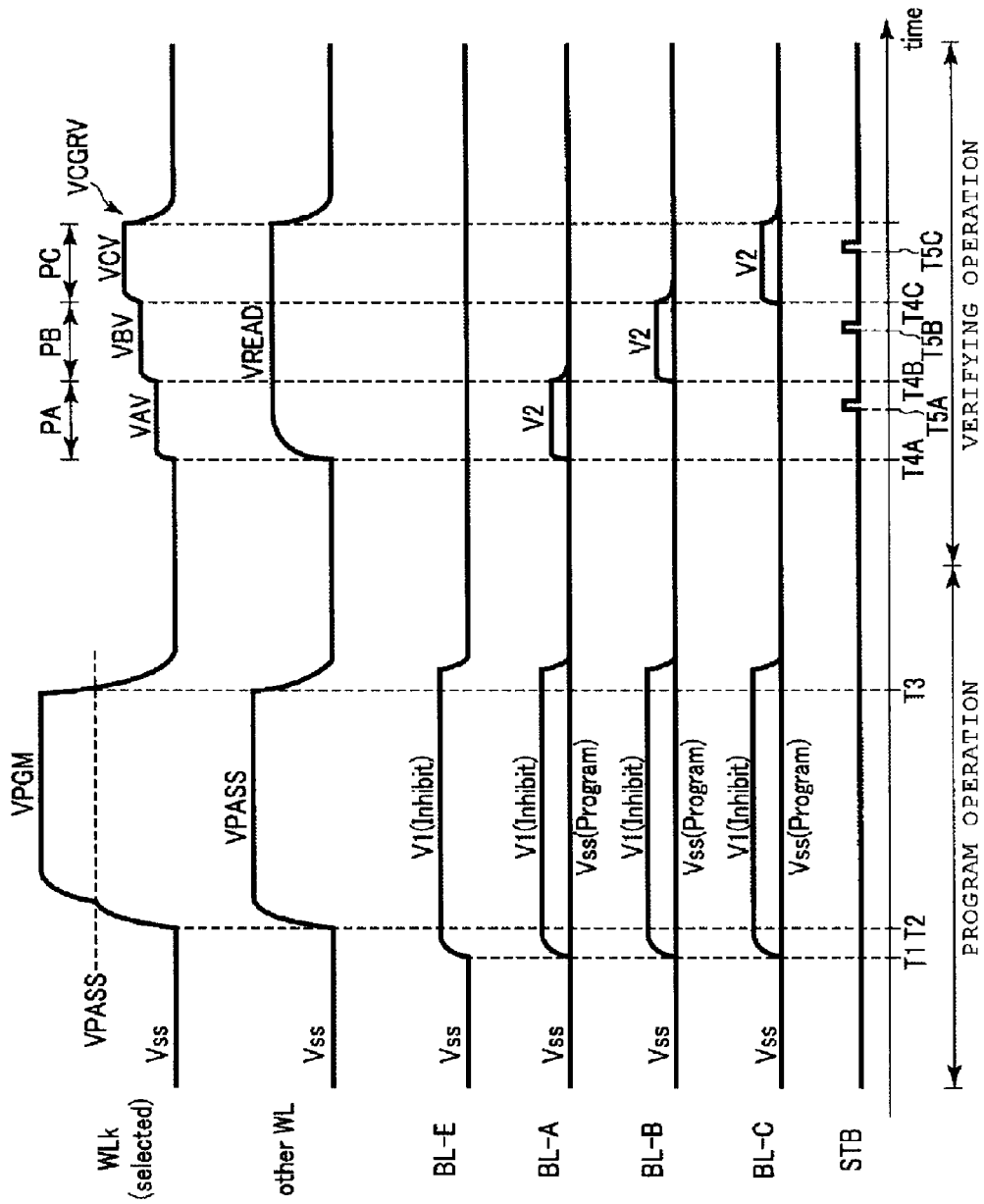
FIG. 7 is a timing chart illustrating an operation example of the memory device according to the embodiment.

As illustrated in a timing chart (horizontal axis: time and vertical axis: signal level and potential) in FIG. 7, one write loop includes at least a program operation and a verifying operation.

The threshold voltage of the memory cell MC is shifted toward a threshold voltage distribution corresponding to data to be written by the program operation.

The program operation is performed by applying a program voltage VPGM to a selected word line WLk. Electrons are injected into a charge storage layer of the memory cell (hereinafter, referred to as a selected cell) MC connected to the selected word line WLk by application of the program voltage VPGM. Therefore, the threshold voltage of the memory cell MC is shifted in a positive direction.

After the program operation, the verifying operation is performed.

The verifying operation verifies whether or not the threshold voltage of the memory cell MC reaches a value corresponding to the data to be written by the verifying operation.

As illustrated in FIG. 7, a voltage value of a verifying voltage VCGRV is changed according to data to be verified.

When the memory cell MC stores the data of two bits (four values), the verifying voltage VCGRV includes a verifying level $V_{AV}$ about the A level, a verifying level $V_{BV}$ about the B level, and a verifying level $V_{CV}$ about the C level.

In a verifying period PA about the A level, which is one of a plurality of verifying periods within the verifying operation, the voltage value of the verifying voltage VCGRV is set as the verifying level $V_{AV}$. In a verifying period PB about the B level, the voltage value of the verifying voltage VCGRV is set as the verifying level $V_{BV}$. In a verifying period PC about the C level, the voltage value of the verifying voltage VCGRV is set as the verifying level $V_{CV}$.

During the verifying operation, the bit line BL is charged (pre-charged) so that a potential V2 is applied to the bit line BL.

An operation (hereinafter, referred to as a sensing operation) for sensing the threshold voltage of the memory cell MC is performed with respect to the bit line BL in which the pre-charge is completed.

Hereinafter, a period from a time T4 when the charging of the bit line is started to a time T5 when the sensing operation of the threshold voltage of the memory cell is started is referred to as a developing period (charge waiting period). The developing period is provided so that a current sensed from a sense amplifier unit side (hereinafter, referred to as a cell current) flowing through the memory cell is converged to a current value of a steady state.

In the embodiment, the pre-charge of the bit line BL is performed by a selective pre-charge process during the verifying operation of the flash memory. The selective pre-charge process performs the pre-charge of the bit line for each data to be written, in a selected time division during the verifying operation. Hereinafter, in the selective pre-charge process, a bit line that is selected is referred to as a selected bit line.

In the selective pre-charge process, in the verifying period PA of the A level, a bit line BL-A connected to an A level cell is pre-charged. On the other hand, in the verifying period PA of the A level, the bit lines BL-B and BL-C connected to a B level cell and a C level cell are not pre-charged. In the verifying period PB of the B level, only the bit line BL-B connected to the B level is selectively pre-charged. In the verifying period PC of the C level, only the bit line BL-C connected to the C level cell is selectively pre-charged.

As described above, the flash memory employing the selective pre-charge process selectively pre-charges the bit line BL at a different timing according to the data to be written. Therefore, the flash memory can reduce a current amount generated during operation.

In the embodiment, during the verifying operation, by a lock-out process being performed according to the data to be written and a verifying result, the ground voltage Vss is applied to a bit line (for example, a bit line BL-E connected to an E level cell) connected to the memory cell which is not necessary to be verified.

In the embodiment, during the verifying operation, lock-out is an operation for applying the ground voltage Vss to the bit line BL connected to the memory cell that is not to be verified. For example, a memory cell (memory cell that is locked out) excluded from a verifying target during the verifying operation is a memory cell of the E level and a memory cell that already passed the verifying operation.

The flash memory according to the embodiment performs the charge (pre-charge) of the bit line BL by using an overdrive operation.

In a normal pre-charge operation, in order to charge the bit line to a certain potential, a target voltage corresponding to a desired potential of the bit line is applied to a gate of a transistor (transistor on a charging path) supplying the charging current on the bit line.

In the overdrive operation, the bit line is charged by operating a transistor in a high driving state by applying a voltage higher than the target voltage to a gate of a transistor supplying the charging current on the bit line. The charging of the bit line is performed at a high speed by the overdrive operation.

In the following description, a state (state in which a gate voltage higher than the target voltage is applied to a transistor) in which a transistor is driven in the overdrive operation is referred to as an overdrive state. In addition, a driving state (for example, a state in which a transistor is driven substantially at the target voltage) lower than the overdrive state is referred to as a normal state.

The flash memory according to the embodiment controls the overdrive operation for each bit line.

Figure 8:
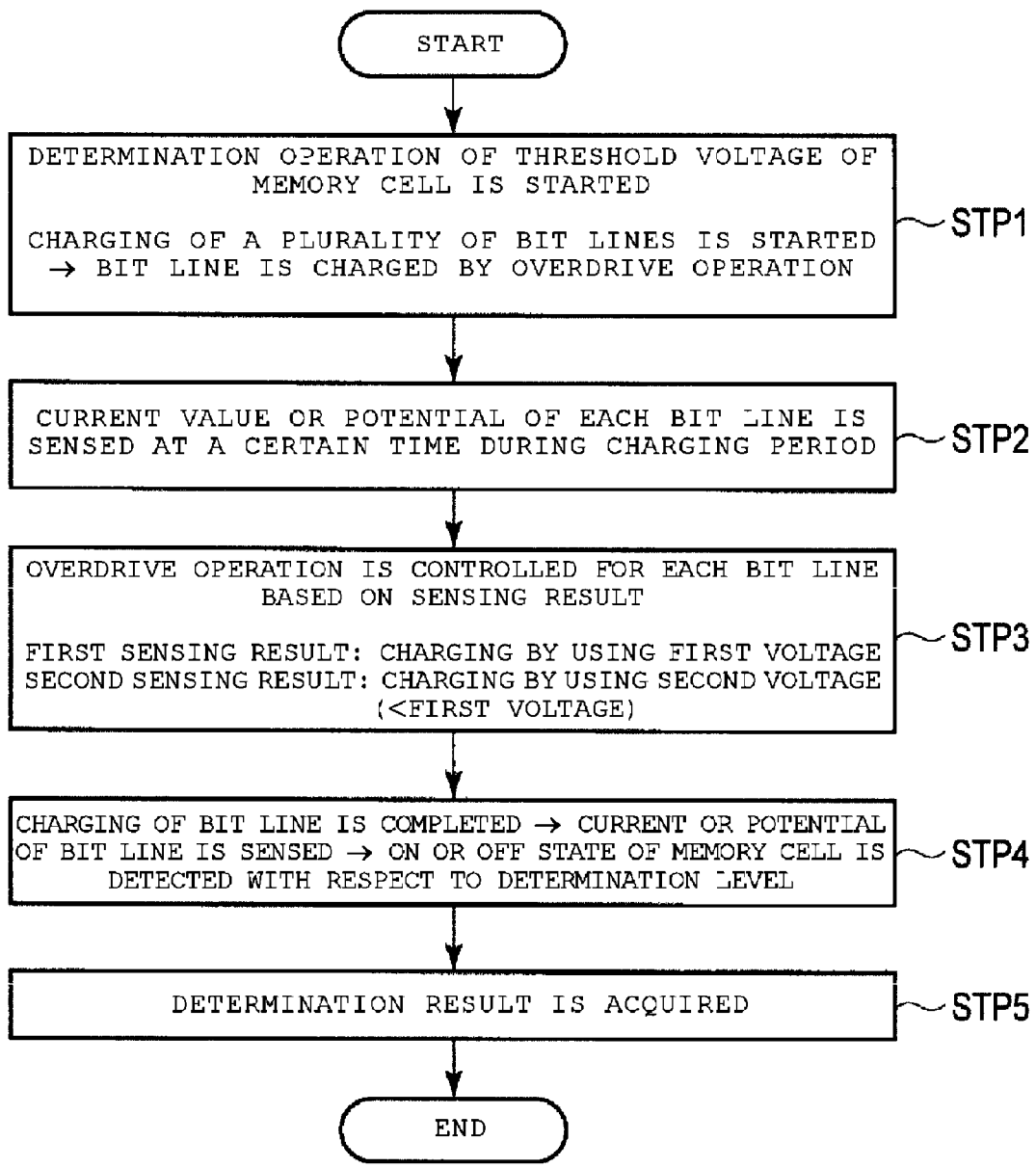
FIG. 8 is a flowchart illustrating an operation example of the memory device according to the embodiment.

For example, the flash memory according to the embodiment performs the flow of operations illustrated in FIG. 8 during a determination operation (for example, verifying operation) of the threshold voltage of the memory cell to set a voltage or a current for the overdrive operation for each bit line.

As illustrated in FIG. 8, during the verifying operation, the charging of the bit line (for example, a bit line selected based on data) is started by the overdrive operation (step STP1).

The overdrive operation is performed in an overdrive period from a time when the charging of the bit line is started to a time before the sensing operation in the developing period. In the overdrive period, the overdrive operation is performed.

The flash memory according to the embodiment performs a pre-sensing operation with respect to the voltage value or the potential (or the current or the potential in the node connected to the bit line) of the bit line during charging by the overdrive operation for each bit line (step STP2).

The pre-sensing operation is a sensing operation of the current value or the potential of the bit line that is performed during the developing period (for example, the overdrive period).

The pre-sensing operation is performed within a pre-sensing period from a time when the charging of the bit line is started to a certain time during the overdrive operation. The pre-sensing operation is performed during a period in which the potential of the bit line BL is changed.

Figure 9:
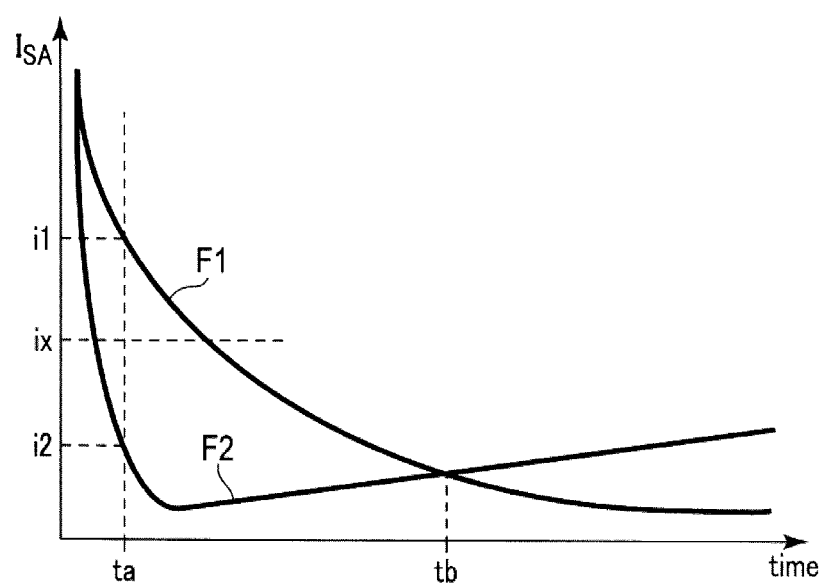
FIG. 9 is graph describing an operation example of the memory device according to the embodiment.

As illustrated in a graph (horizontal axis: time and vertical axis: a current value of a current ISA) in FIG. 9, a size of the current (changing current) ISA supplied on the bit line from the sense amplifier circuit is different for each bit line.

The memory cell (hereinafter, also referred to as an ON-cell) of the ON state and the memory cell (hereinafter, also referred to as an OFF-cell) of the OFF state are connected to the selected word line WLk to which the verifying voltage is applied.

For example, at a time during charging of the bit line by the overdrive operation, the current value of the current (charging current) ISA varies according to ON or OFF state of the memory cell MC connected to the bit line BL and a state of a potential of another bit line adjacent to a selected bit line BL.

In FIG. 9, a line F1 indicates a charging current of a bit line connected to the OFF-cell when a bit line to which the ground voltage is applied is adjacent to a bit line to which the OFF-cell is connected. In addition, a line F2 indicates a charging current of a bit line connected to the ON-cell when a bit line during charging is adjacent to a bit line to which the ON-cell is connected.

A current value of the charging current F1 indicates a first current value i1 at a time ta during the pre-charge of the bit line. On the other hand, a current value of the charging current F2 indicates a second current value i2 at the time ta.

The second current value i2 is different from the first current value i1. For example, the second current value i2 has a value of approximately ½ to ⅓ of the first current value i1. Thus, an intermediate value ix of two current values i1 and i2 or an intermediate value of potentials respectively corresponding to the two current values i1 and i2 is used for a determination reference, whereby it is possible to determine a difference in a charging speed (charging state) of the bit line.

The charging speed of the bit line connected to the ON-cell is faster than the charging speed of the bit line connected to the OFF-cell.

The flash memory according to the embodiment senses current values i1 and i2 of a node within the sense amplifier circuit 13 (the sense amplifier unit 131) as illustrated in FIG. 9 or a potential of a node corresponding to a difference in the current values i1 and i2.

A signal corresponding to a sensing result of a current value or a potential in the pre-sensing operation is held inside (for example, wiring or nodes) of the sense amplifier circuit as a result of the pre-sensing operation.

Here, returning to FIG. 8, the description of the operation of the flash memory will be continued.

After the pre-sensing operation, the flash memory according to the embodiment controls intensity or a period of the overdrive operation in a control period for each bit line BL in accordance with the result of the pre-sensing operation for each bit line BL (step STP3).

The intensity of the overdrive operation corresponds to a size of the voltage or the current supplied on the bit line for the pre-charge of the bit line. In the control period, the intensity of the overdrive operation is controlled based on a result of the pre-sensing operation in the overdrive period.

The bit line that is selected by the overdrive operation that is controlled based on the pre-sensing operation is pre-charged by using a voltage or current potential in which a difference in the charging speed (size of the charging current) of the bit line is taken into account.

For example, when the result of the pre-sensing operation indicates a first result corresponding to the charging current F1, the pre-charge operation in which the first voltage is transferred to the bit line is performed in the control period (at least a part of a period from the time ta to the time tb).

On the other hand, when the result of the pre-sensing operation indicates a second result corresponding to the charging current F2, the pre-charge operation in which the second voltage lower than the first voltage is transferred to the bit line is performed in the control period.

The sensing operation is performed with respect to the bit line BL for determination of the threshold voltage of the memory cell MC at a certain time tb (for example, a time T5 in FIG. 7) after the developing period is elapsed (step STP4).

As a result of the sensing operation, a signal corresponding to ON or OFF of a memory cell connected to a selected word line WLk is detected.

The flash memory 1 acquires the result of the sensing operation as a determination result of the threshold voltage of the memory cell (step STP5). Therefore, a verifying result (or data in the memory cell during wiring data) during writing data is acquired.

As described above, the flash memory according to the embodiment controls the intensity of the overdrive operation (pre-charge) with respect to the bit line based on the sensing result in the current value or the voltage value of the bit line during charging.

Therefore, the flash memory according to the embodiment can improve the speed and reliability of the operation.

2-2. Specific Example

An operation example of the flash memory according to the embodiment will be described in detail with reference to FIGS. 10 to 13. In addition, here, the specific example of the flash memory according to the embodiment will be described with reference to FIGS. 1 to 9 appropriately in addition to FIGS. 10 to 13.

The memory system including the flash memory according to the embodiment performs a write operation as follows.

The host device 600 in FIG. 1 transmits a data write request with respect to the storage device 500.

The memory controller 5 transmits a write command, an address (select address) to be written, and data to be written to the flash memory 1 in response to a request from the host device 600.

The flash memory 1 receives the write command, the select address, and data.

The sequencer 19 in FIG. 2 starts the write operation based on a command.

a. Program Operation

The sequencer 19 controls each circuit within the flash memory 1 so as to perform the program operation in the write loop in FIG. 7.

A voltage generating circuit 40 generates various voltages used to write data by control of the sequencer 19.

The data to be written is transferred to the data retention circuit 14. Data of an upper page and data of a lower page are stored in the data latches DL within the data retention circuit 14 and the sense amplifier circuit 13. In one example, both the upper data and the lower data may be supplied from the memory controller 5 (or the host device 600). In another example, the upper data is supplied from the memory controller 5 and the lower data may be supplied from the inside of the memory cell array 11.

In the sense amplifier circuit 13, the sense amplifier unit 131 controls the potential of the bit line BL based on information (for example, the data to be written and the result of the verifying operation) held in the data latch DL. Here, a write cell and a write-inhibited cell are connected to a selected word line WLk. The write cell is a memory cell in which the threshold voltage is shifted. The write-inhibited cell is a memory cell in which the threshold voltage is not shifted.

Time T1

As illustrated in FIG. 7, at a time T1, the sense amplifier unit 131 applies the voltage Vss to the bit line BL connected to the write cell. The sense amplifier unit 131 applies a voltage V1 greater than 0 V to the bit line BL connected to the write-inhibited cell.

The source line driver 15 applies a voltage having a certain size to the source line SL. The well driver 16 applies the ground voltage Vss to the well region 20.

The row control circuit 12 applies the voltage Vss to a selected source-side select gate line SGS in a selected string unit SU based on the control of the sequencer 19. The row control circuit 12 applies an ON voltage VSGD to a selected drain-side select gate line SGD in the selected string unit SU.

Therefore, for the write cell, the bit line BL is electrically connected to a semiconductor pillar 75 via the drain-side select transistor ST1 of the ON state.

On the other hand, for the write-inhibited cell, a bit line corresponding to the write-inhibited cell is electrically isolated from the semiconductor pillar 75 by the drain-side select transistor ST1 that is cut off.

Time T2 to T3

At a time T2, the row control circuit 12 applies an non-selected voltage (writing pass voltage) VPASS to a word line (non-selected word line) other WL other than the selected word line.

In addition, the row control circuit 12 applies a writing pass voltage VPASS to the selected word line WLk simultaneously with the application of the voltage VPASS with respect to the non-selected word line other WL. A symbol k is an integer 0 or more and n−1 or less.

Thereafter, at a certain time after the time T2, the row control circuit 12 applies the program voltage VPGM to the selected word line WLk. The potential of the selected word line WLk is increased from the writing pass voltage VPASS to the program voltage VPGM.

Therefore, for the memory cell MC connected to the selected word line WLk, electrons are injected into a memory film 79 of the write cell. A value of the threshold voltage of the memory cell MC is shifted from a value before the application of the program voltage VPGM in a direction of a positive voltage value.

On the other hand, a potential of a channel region of the write-inhibited cell is boosted up. Therefore, injection of the electrons into the memory film 79 of the write-inhibited cell is prevented.

After the application of the program voltage VPGM, the sequencer 19 controls the operation of each circuit so as to complete the program operation. The row control circuit 12 sets the potential of the word lines WLk and other WL, and the select gate lines SGD and SGS to the voltage Vss after time T3. The sense amplifier circuit 13 sets the potential of the bit line to the voltage Vss.

The sequencer 19 performs the verifying operation after the program operation.

b. Verifying Operation

Time T4A

The source line driver 15 applies a source line voltage of a certain voltage value to a source line CELSRC during the verifying operation. The well driver 16 applies a well voltage of a certain voltage value to a well region CPWELL.

The row control circuit 12 applies a voltage VSG to the drain-side and source-side select gate lines SGD and SGS to turn on the select transistors ST1 and ST2.

The row control circuit 12 applies the non-selected voltage (read pass voltage) VREAD to the non-selected word lines other WLs. Memory cells connected to the non-selected word lines other WLs are turned on.

At a time T4A, the row control circuit 12 applies the verifying voltage (read voltage) VCGRV to the selected word line WLk.

The verifying operation of the flash memory according to the embodiment is performed as follows. In the embodiment, in the verifying operation, the charging of the bit line is selectively performed by the selective pre-charge process. In addition, in the embodiment, the charging of the bit line is performed by control operations including the overdrive operation.

Verification of A Level

Control of the bit line during verifying of the A level in the flash memory according to the embodiment will be described with reference to FIG. 10.

In the following description, a signal level (voltage value equal to or greater than the threshold voltage) that turns on the n-type transistor is referred to as an H (high) level regardless of the magnitude of the voltage value. In addition, a signal level that turns off the n-type transistor is referred to as an L (low) level. In this case, the p-type transistor is turned off by the signal of the H level and the p-type transistor is turned on by the signal of the L level.

The sequencer 19 operates the sense amplifier unit 131 (in particular, the bit line control circuit 300) to perform the charge (pre-charge) of the bit line during the verifying operation.

The sense amplifier unit 131 corresponding to the A level cell controls the pre-charge of the bit line BL-A connected to the memory cell MC to be verified.

On the other hand, for the sense amplifier units 131 corresponding to the B level cell and the C level cell, each sense amplifier unit 131 applies the ground voltage Vss to the bit lines BL-B and BL-C connected to the B level cell and the C level cell based on information within the data latch DL (and within the data retention circuit 14).

In addition, for the sense amplifier unit 131 corresponding to the E level cell, the bit line control circuit 300 applies the ground voltage Vss to the bit line BL-E connected to the E level cell by lock-outing based on information within the data latch DL. A potential of the bit line BL-E connected to the E level cell is maintained at the ground voltage Vss from the start of the verifying operation to the completion thereof.

In the embodiment, as described below, the bit line control circuit 300 controls a signal level (potential or voltage value) of each control signal with respect to a transistor connected to the charging path of the bit line BL-A under control of the sequencer 19 and the sense amplifier circuit 13 to perform the overdrive operation that is controlled for each bit line.
Time T40 to T42

As illustrated in a timing chart (horizontal axis: time and vertical axis: signal level and potential) in FIG. 10, at a time T40 (time T4A), the bit line control circuit 300 changes the signal level of the control signal BLS from the ground voltage (L level) Vss to the voltage value VBLS. Therefore, the transistor S1 is turned on. For example, the voltage value VBLS is approximately 7 V.

The transistor S1 of the ON state connects the bit line BL-A to the node BLI.

At a time T41, the bit line control circuit 300 sets the signal levels of the control signal BLC and the control signal BLX respectively to voltage values (H level) VBLC1 and VBLX1 higher than the ground voltage Vss. Therefore, the transistor S2 and the transistor S3 are turned on.

For example, the voltage value VBLC1 is approximately 0.5 V+Vtn+α. The voltage value VBLX1 is approximately 0.75 V+Vtn+α. "Vtn" indicates the threshold voltage of the n-type transistor. "α" indicates a correction voltage value (hereinafter, referred to as an overdrive voltage) for the overdrive operation. For example, 0.5 V+Vtn and 0.75 V+Vtn respectively correspond to the target voltage of each of the transistors S2 and S3.

Therefore, in the bit line BL-A connected to the A level cell, the charge (pre-charge) of the bit line BL-A is started by the overdrive operation of the transistors S2 and S3.

The node SCOM is electrically connected to the node SSRC by the transistor S3 of the ON state (overdrive state).

In this case, the signal of the node INV-S of the data latch DL1 is supplied on the gates of the transistors S4A and S4B.

For the sense amplifier unit 131 corresponding to the memory cell (here, the A level cell) of the verifying target, the data latch DL1 retains the signal of the L level in the signal INV-S. Therefore, the n-type transistor S4a is turned off and the p-type transistor S4b is turned on. The node VDDSA is electrically connected to the node SSRC via the p-type transistor S4b of the ON state.

In this case, the transistor S3 transfers a voltage (for example, 2.5 V) applied to the node VDDSA to the node SCOM so that the potential of the node SCOM is clamped to a potential in accordance with the gate voltage of the transistor S3.

For the sense amplifier unit 131 corresponding to the memory cell (for example, the memory cell of that has passed the verifying operation) of the target of lock-out among the A level cells, the data latch DL1 retains the signal of the H level in the signal INV-S. Therefore, the n-type transistor S4a is turned on and the p-type transistor S4b is turned off. The node SRCGND is connected to the node SSRC via the n-type transistor S4a of the ON state.

In this case, the transistor S3 transfers the ground voltage Vss to the node SCOM. As a result, the bit line BL connected to the node SCOM to which the ground voltage Vss is applied is locked-out.

At a time T42, the bit line control circuit 300 changes the signal level of the control signal HLL from the L level to the H level. For example, the control signal HLL of the H level has a voltage value of approximately 4 V.

The transistor S6 is turned on by the signal HLL of the H level. Therefore, the node SEN is charged approximately to the potential (for example, 2.5 V) of the node VSENP.

In addition, at the time T42, the bit line control circuit 300 changes the signal level of the control signal LPC from the L level to the H level. Transistor S12 is turned on by the control signal LPC of the H level. The bus LBUS is changed approximately to the potential (for example, 2.5V) of the node VHLB by transistor S12 of the ON state.
Time T43

After the control signals HLL and LPC are transited from the H level to the L level, at a time T43, the bit line control circuit 300 changes the signal level of the control signal XXL from the ground voltage Vss to a voltage value VXXL1. The transistor S5 is turned on by a control signal XXL1. Therefore, the pre-sensing operation is started during an overdrive period OD. For example, the voltage value VXXL1 has a value of approximately 1.0 V+Vtn+α.

The node SEN is electrically connected to the node SCOM by the transistor S5 of the ON state (overdrive state). The node SEN of which charge is completed is electrically connected to the bit line BL-A during charging via the nodes BLI and SCOM.

The potential of the node SEN is changed in accordance with the charging speed (size of the charging current flowing from the sense amplifier unit 131 to the bit line BL-A) of the bit line BL-A.

A variation amount and a changing speed of the potential of the node SEN vary according to the charging speed of the bit line BL-A. As illustrated in FIG. 9 described above, the charging speed of the bit line may be changed, for example, according to the ON or OFF state of the memory cell (memory cell of the verifying target) electrically connected to the bit line and a potential (charged state or discharged state) of another bit line adjacent to the bit line connected to the memory cell of the verifying target.

When the charging speed of the bit line BL-A is slow, the potential of the node SEN is decreased from the voltage value VSENP to the ground voltage (L level) Vss at a certain time between the time T43 and a time T44.

When the charging speed of the bit line BL-A is fast, the node SEN has a potential (for example, the H level) higher than the ground voltage Vss at a certain time between the time T43 and the time T44. The potential of the node SEN when the charging speed of the bit line BL-A is fast, is higher than the potential of the node SEN when the charging speed of the bit line BL-A is slow. Meanwhile, in this case, the potential (H level) of the node SEN connected to the bit line of a fast charging speed is equal to or less than the voltage value VSENP.

As described above, a difference in the charging speed (potential or current value of the bit line at a certain time) of the bit line BL-A during the pre-charge period is reflected on the potential of the node SEN.

In addition, at the time T43, the potential of the node SEN connected to the bit line that is locked out among the bit lines BL-A connected to the A level cell is set as the ground voltage Vss.

Time T44

At the time T44, the bit line control circuit 300 sets the signal level of the control signal XXL to the L level. The transistor S5 is turned off by the signal of the L level and the node SEN is electrically isolated from the node SCOM.

Therefore, for each sense amplifier unit 131 corresponding to the memory cell (here, the A level cell) of the verifying target, a signal indicating a result (potential of the bit line at a certain time during the pre-sensing period PS) of the pre-sensing operation with respect to the bit line BL-A is temporarily held within the node SEN as the potential of the node SEN.

The data latch DL1 changes the signal level of the control signal STL from the L level to the H level. The transistor (transfer gate) Q7a is turned on by the control signal STL of the H level.

The node LAT-S of the data latch DL1 is electrically connected to the bus LBUS via the transistor Q7a of the ON state. The potential of the bus LBUS is maintained or changed according to the potential of the node LAT-S.

For example, for the sense amplifier unit 131 corresponding to the memory cell (here, the A level cell) of the verifying target, the latch DL1 maintains the signal of the H level in the node LAT-S. In this case, the bus LBUS maintains the charged state.

For the sense amplifier unit 131 corresponding to the A level cell which is locked-out, the data latch DL1 retains the signal of the L level in the node LAT-S. In this case, the bus LBUS is discharged according to a timing when the control signal STL is set as the H level. Therefore, for the sense amplifier unit 131 corresponding to the A level cell which is locked-out, the potential of the bus LBUS is set as the ground voltage Vss.

Time T45

At a time T45, the bit line control circuit 300 changes the signal level of the control signal STB from the L level to the H level. The transistor S7 is turned on by the control signal STB of the H level.

Here, the transistor S8 is turned on or turned off according to the potential of the node SEN based on the result of the pre-sensing operation.

Figure 11A:
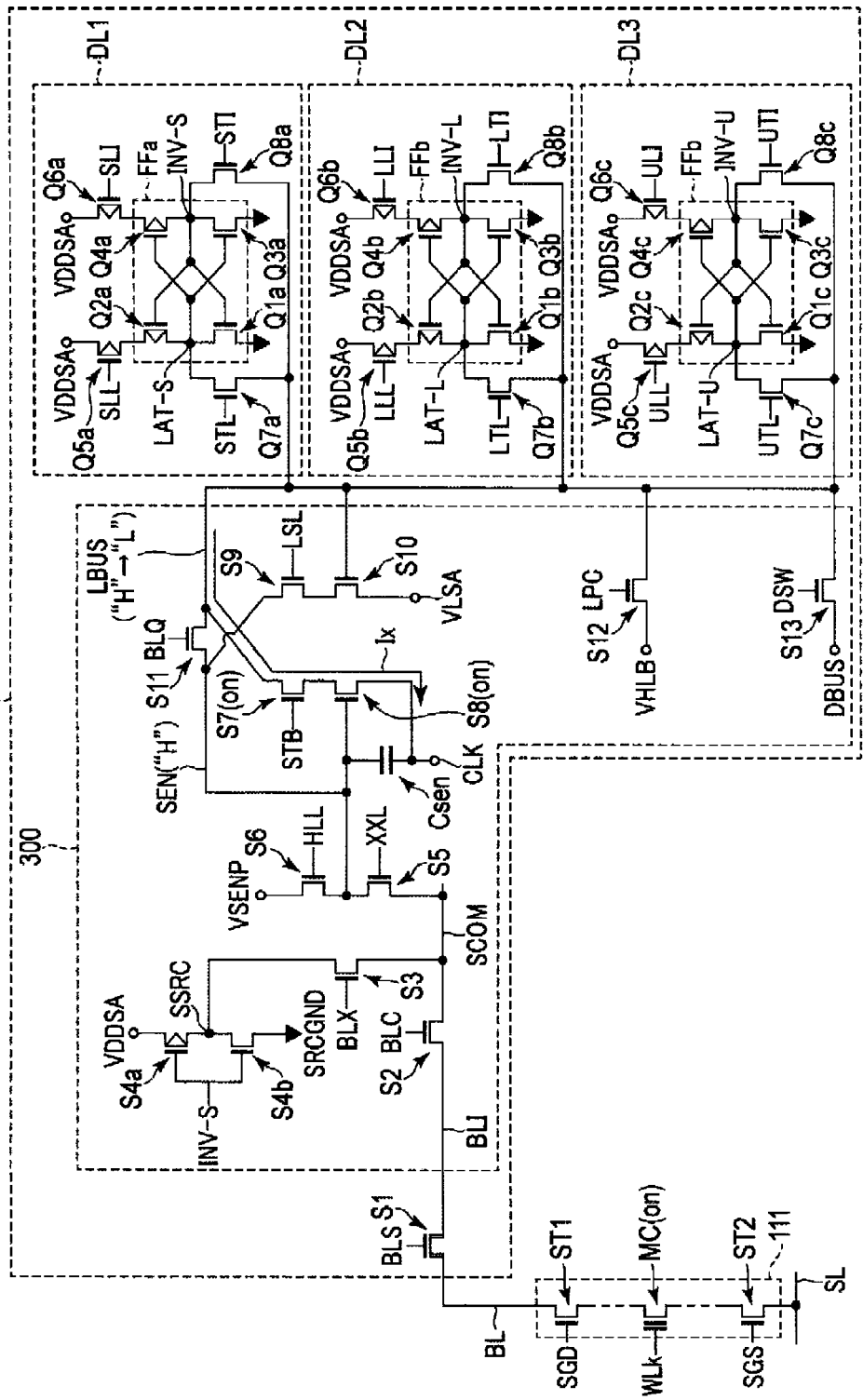
FIG. 11A is a schematic view describing an operation example of the memory device according to the embodiment.
Figure 11B:
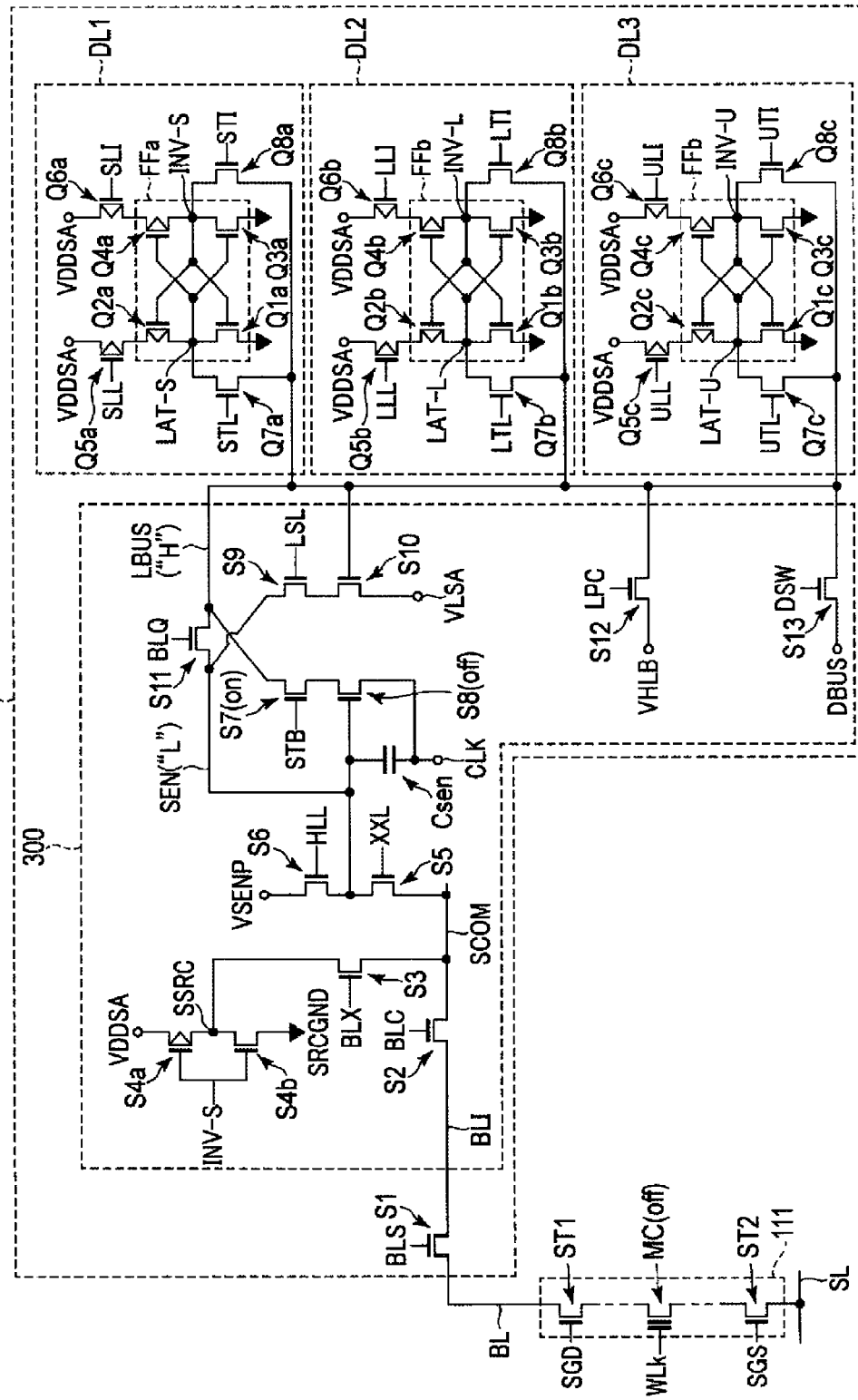
FIG. 11B is a schematic view describing an operation example of the memory device according to the embodiment.

FIGS. 11A and 11B are schematic views describing a relationship between a result of the pre-sensing operation and a potential state of a node.

As illustrated in FIG. 11A, when the node SEN is in the H level (case in which the node SEN is the charged state), the transistor S8 is turned on.

The bus LBUS is electrically connected to the node CLK by the transistors S7 and S8 of the ON state. Therefore, a current Ix flows from the bus LBUS toward the node CLK. As a result, the potential of the bus LBUS is set approximately to the potential of the node CLK. For example, when the potential of the node CLK is the ground voltage Vss, the bus LBUS is discharged and the potential of the bus LBUS is approximately the ground voltage (L level) Vss.

On the other hand, as illustrated in FIG. 11B, when the node SEN is in the L level (case in which the node SEN is in the discharged state), the transistor S8 is turned off.

The bus LBUS is electrically isolated from the node CLK by the transistor S8 of the OFF state. In this case, the bus LBUS maintains the charged state (H level).

After a period ensured to stabilize the potential of the bus LBUS is elapsed, the bit line control circuit 300 sets the signal level of the control signal STB to the L level.

As described above, a result of the pre-sensing operation with respect to the bit line BL-A during charging is transferred from the node SEN to the bus LBUS. The potential of the bus LBUS is set as any one of the L level and the H level according to the result of the pre-sensing operation. As a result, the bus LBUS maintains the result of the pre-sensing operation of the bit line BL-A.

Following the pre-sensing period PS, in a period (control period) CTL to from a time T46 to a time T48, the overdrive operation is controlled for each bit line BL-A based on the result of the pre-sensing operation.

Time T46

After the control signal STB is set as the L level, the bit line control circuit 300 boosts the potential of the node VLSA to the voltage VLSA (for example, approximately 2.5 V) higher than the ground voltage Vss.

At the time T46, the bit line control circuit 300 decreases the signal level of the control signal BLX from the voltage VBLX1 to the voltage VBLX2 (VBLX2>Vtn). When the voltage VBLX2 is applied to the gate of the transistor S3, the transistor S3 maintains the ON state. For example, the voltage VBLX2 is approximately 0.5 V+Vtn.

A drive force of the transistor S3 is reduced with the decrease in the gate voltage. An output current of the transistor S3 in which the voltage VBLX2 is applied to the gate is reduced compared to an output current of the transistor S3 in which the voltage VBLX1 is applied to the gate.

As described above, the state of the transistor S3 is changed from the overdrive state to a normal driving state.

The bit line control circuit 300 changes the signal level of the control signal XXL from the ground voltage Vss to approximately the voltage value VXXL2. For example, the voltage value VXXL2 is equal to or less than the voltage value VXXL1. The potential VXXL2 is approximately 0.75 V+Vtn+α. Therefore, the transistor S5 is turned on and the node SEN is electrically connected to the bit line BL-A.

As described above, the transistor S5 is driven in the overdrive state.

In addition, in a period CTL from the time T45 to the time T46, the signal level of the control signal BLC may be set as a value different from the voltage value VBLC1. For example, in the period CTL, the signal level of the control signal BLC may be set as a voltage value VBLC1z higher than the voltage value VBLC1 or may be set as a level lower than the voltage value VBLC1.

The transistors S1 and S2 maintain the ON state in the period from the time T40 to the time T45. In this case, the transistor S2 operates in the overdrive state.

The bit line control circuit 300 changes the signal level of the control signal LSL from the L level to the H level substantially simultaneously that the control signal XXL is set as the voltage value VXXL2. Therefore, the transistor S9 is turned on.

Here, the gate of the transistor S10 is connected to the bus LBUS. The bus LBUS holds the result of the pre-sensing operation as the potential.

Therefore, the transistor S10 is turned on or turned off based on the result of the pre-sensing operation held within the bus LBUS.

Figure 12A:
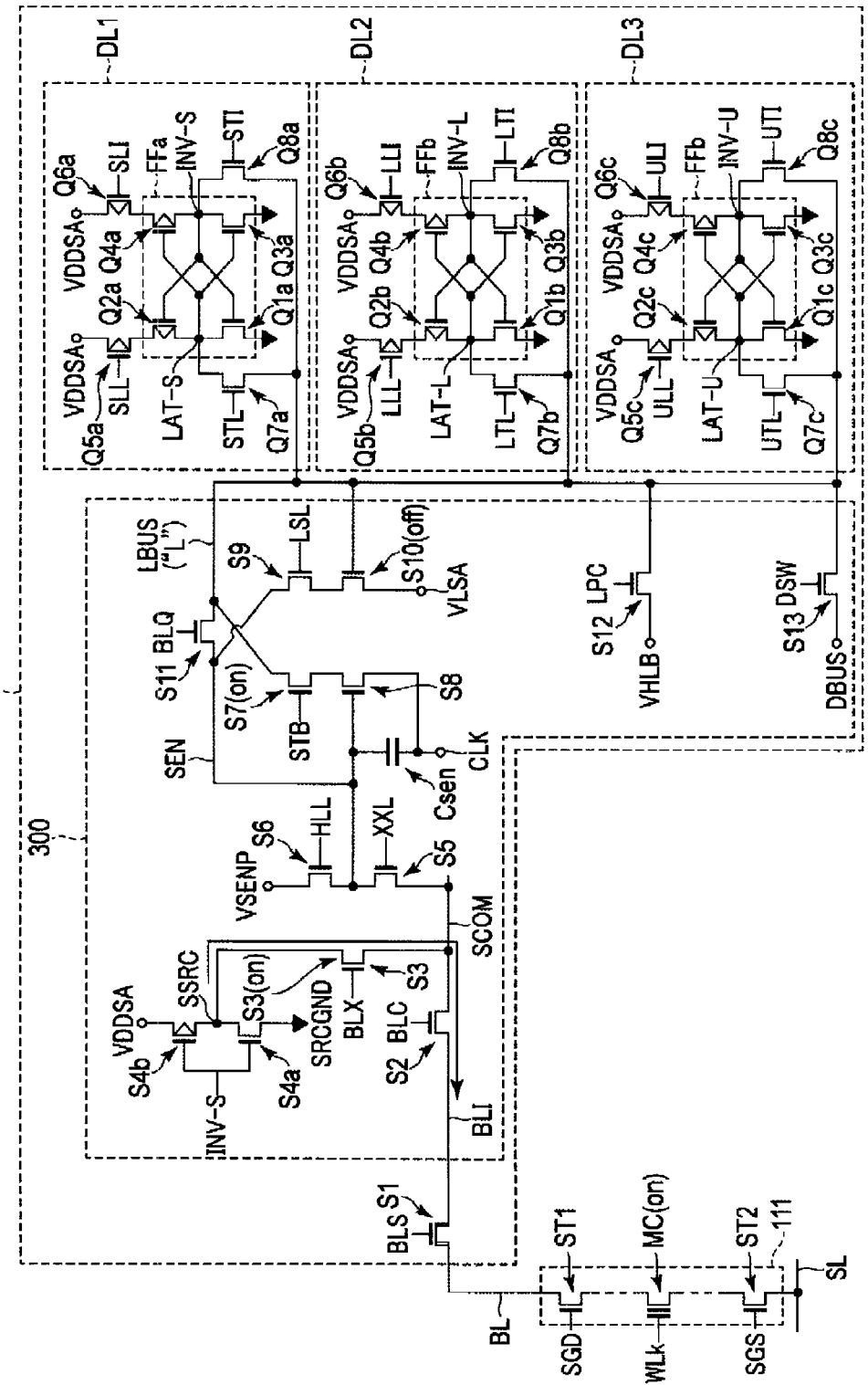
FIG. 12A is a schematic view describing an operation example of the memory device according to the embodiment.
Figure 12B:
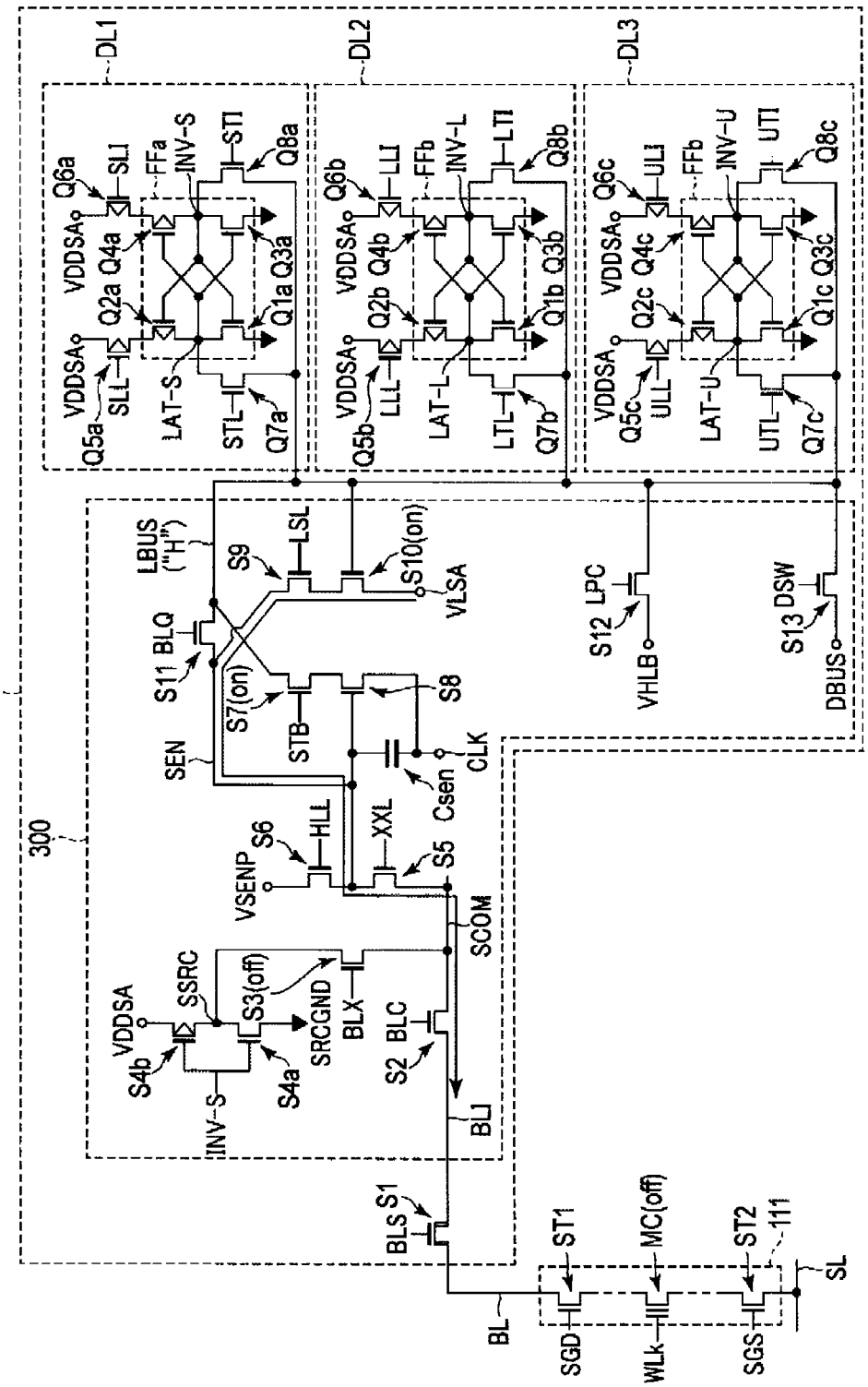
FIG. 12B is a schematic view describing an operation example of the memory device according to the embodiment.

FIGS. 12A and 12B are schematic views describing a relationship between a result of the pre-sensing operation and the charging path of the bit line.

First, when the charging speed of the bit line is fast, the pre-sensing operation will be described.

FIG. 12A illustrates a path of the charging current with respect to the bit line when the potential of the bus LBUS is in the L level according to the result of the pre-sensing operation (for example, a case in which the charging speed of the bit line is fast).

As illustrated in FIG. 12A, when the potential of the bus LBUS is in the L level, the transistor S10 is turned off.

The node SEN (and the node SCOM) is electrically isolated from the node VLSA by the transistor S10 of the OFF state. That is, the node SCOM is not charged by the potential of the node VLSA.

On the other hand, the transistor S3 transfers the potential of the node SSRC to the node SCOM. The transistor S3 is operated so that the potential of the node SCOM is clamped approximately to a potential obtained by subtracting the threshold voltage of the transistor S3 from the gate voltage of the transistor S3. The transistor S2 transfers the potential of the node SCOM to the bit line BL-A via the node BLI and the transistor S1. That is, the node SCOM is charged by the voltage of the node VDDSA via the transistor S3 on the node SSRC side. For example, the potential of the node SSRC is equal to or less than the potential of the node VLSA.

A potential transferred to a bit line of which a charging speed from the node SCOM is fast will be described in detail.

In a case of FIG. 12A, the potential of the node SCOM is lower than the voltage value VBLC1 of the gate voltage of the transistor S2. Therefore, even when the overdrive voltage is added to the gate voltage of the transistor S2 (state in which the transistor S2 is overdriven), the potential of the node SCOM is transferred to the bit line BL-A.

In this case, for the bit line BL-A corresponding to the memory cell of the verifying target, a voltage value VBLX2-Vtn obtained by subtracting the threshold voltage of the transistor S3 from the gate voltage of the transistor S3 is transferred to the bit line BL-A. For example, a voltage of approximately 0.5 V is transferred to the node BLI and the bit line BL-A.

Therefore, the bit line BL-A is charged by the output current (output voltage) from the transistor S3 on the node SSRC side.

As illustrated in FIG. 12A, when the charging speed of the bit line BL-A is fast, the bit line control circuit 300 transfers a voltage, which does not include an overdrive voltage α on the node SCOM, to the bit line BL-A. As described above, when the potential of the bus LBUS is in the L level, the overdrive operation with respect to the bit line BL-A is stopped.

As a result, in the embodiment, it is possible to suppress overcharge of the bit line of which the charging speed is fast by the charge from the node SSRC. Therefore, in the embodiment, it is possible to prevent erroneous determination of the threshold voltage of the memory cell due to the overcharge of the bit line.

In addition, when the memory cell MC is locked out, similar to the case of FIG. 12A, the potential of the bus LBUS is in the L level. In addition, the ground voltage Vss is applied to the node SSRC by the signal of the H level in the node INV-S. Therefore, the ground voltage Vss is supplied on the bit line BL-A via the transistor S3 of the ON state.

Therefore, in the bit line corresponding to the memory cell that is locked out, the potential of the bit line is set approximately to the ground voltage Vss.

Next, when the charging speed of the bit line is slow, the pre-sensing operation will be described.

FIG. 12B illustrates a path of the charging current with respect to the bit line when the potential of the bus LBUS is in the H level according to the result of the pre-sensing operation (case in which the charging speed of the bit line is slow).

As illustrated in FIG. 12B, when the potential of the bus LBUS is in the H level, the transistor S10 is turned on. Therefore, the node VLSA is electrically connected to the node SEN and the node SCOM via two transistors S9 and S10 of the ON state. That is, the node SCOM is charged by the potential (output current or output voltage of the transistor S5) of the node VLSA having a potential higher than the output voltage of the transistor S3.

The potential of the node SCOM is increased by the supply of the voltage from the node VLSA. The node SCOM is clamped approximately with a voltage value obtained by subtracting the threshold voltage Vtn of the transistor S5 from the gate voltage VXXL2 of the transistor S5. The potential of the node SCOM is set approximately as the voltage value VXXL2-Vtn by the transistor S5 of the overdrive state. For example, the potential of the node SCOM is approximately 0.75 V+α.

In this case, a potential of one end of the transistor S3 on the node SCOM side is higher than the gate voltage (voltage VBLX2) of the transistor S3. Therefore, the transistor S3 is cut off. Thus, the node SSRC is electrically isolated from the node SCOM by the transistor S3 of a cut-off state. Therefore, the potential of the node SSRC is not applied to the node SCOM.

The transistor S2 of the overdrive state transfers the potential of the node SCOM to the bit line BL-A via the node BLI. The transistor S2 is operated so that the voltage to be transferred to the bit line BL-A is clamped approximately to a level according to the voltage value VBLC1 of the gate voltage of the transistor S2.

As described above, the node SCOM is charged by the voltage of the node VLSA via the transistors S5, S9, and S10 on the node VLSA side.

The potential transferred to the bit line of which the charging speed from the node SCOM is slow will be described in detail.

In the case of FIG. 12B, the potential of the node SCOM is equal to or greater than the voltage value VBLC1 of the gate voltage of the transistor S2. The potential transferred to the bit line BL-A by the transistor S2 of the overdrive state is set approximately as the voltage value VBLC1-Vtn obtained by subtracting the threshold voltage Vtn from the voltage value VBLC1 of the gate voltage of the transistor S2. For example, a voltage of approximately 0.5 V+a is transferred to the bit line BL-A.

Therefore, the bit line BL-A is charged by the output current (output voltage) from the transistor S5 of the overdrive state on the node VLSA side.

A voltage (here, 0.5 V+α) transferred from the transistor S5 of the overdrive state to the bit line BL-A is higher than the voltage transferred from the transistor S3 to the bit line BL-A.

Therefore, intensity of the overdrive operation when the potential of the bus LBUS is in the H level is stronger than intensity of the overdrive operation when the potential of the bus LBUS is in the L level.

As described above, when the charging speed of the bit line is slow, the bit line control circuit 300 pre-charges the bit line BL-A by using a voltage including the overdrive voltage α. Therefore, when the potential of the bus LBUS is in the H level, the overdrive operation with respect to the bit line BL-A is continued.

As a result, in the embodiment, the node VLSA which can output a potential higher than the output of the transistor S3 on the node SSRC side is connected to the bit line of which the charging speed is slow via the transistors S5, S9, and S10, whereby the charge of the bit line BL can be made faster.

As described above, as illustrated in FIGS. 12A and 12B, the flash memory according to the embodiment pre-senses the difference in the charging speed of the bit line, whereby it is possible to switch the charging path of the bit line according to the result of the pre-sensing operation with respect to the bit line during charging.

As a result, for the bit line of which the charging speed is fast the flash memory according to the embodiment can suppress overcharge of the bit line and to prevent erroneous determination of the threshold voltage of the memory cell.

On the other hand, for the bit line of which the charging speed is slow, the flash memory according to the embodiment can perform the charge of the bit line in the overdrive state and to make the charge of the bit line faster.

Time T47

At a time T47, the bit line control circuit 300 decreases the signal level of the control signal BLC from the voltage value VBLC1 to a voltage value VBLC2 (Vtn). The voltage value VBLC2 is a voltage value obtained by subtracting the overdrive voltage α from the voltage value VBLC1. Therefore, the overdrive state of the transistor S2 is stopped. The transistor S2 is operated in the normal state. The voltage value VBLC2 is, for example, approximately 0.5 V+Vtn.

The bit line control circuit 300 increases the level of the control signal BLX from the voltage VBLX2 to a voltage VBLX3. The voltage VBLX3 is, for example, approximately 0.75 V+Vtn.

The bit line control circuit 300 decreases the control signal XXL from the voltage value VXXL2 to the ground voltage Vss. The bit line control circuit 300 changes the signal level of the control signal LSL from the H level to the L level. Therefore, the node SEN and the node VLSA are electrically isolated from the node SCOM.

Thereafter, the bit line control circuit 300 sets the potential of the node VLSA as the L level.

The charging period OD of the bit line BL-A is completed by the overdrive operation by the control described above. Thereafter, in the developing period DVL, the charging operation of the bit line is continued by using the normal target voltage.

In the overdrive period OD, an effective period of the overdrive operation with respect to the bit line BL-A of which the charging speed is slow is a period from the time T41 to the time T46. An effective period of the overdrive operation with respect to the bit line BL-A of which the charging speed is fast is a period from the time T41 to the time T47.

Therefore, the effective period of the overdrive operation with respect to the bit line (for example, the bit line connected to the ON-cell) of which the charging speed is fast can be shorter than the effective period of the overdrive operation with respect to the bit line (for example, the bit line connected to the OFF-cell) of which the charging speed is slow.

As described above, during the overdrive operation, the flash memory according to the embodiment pre-senses the potential of the bit line during charging. The flash memory according to the embodiment can control the intensity (size of the voltage used for charging the bit line) and the period of the overdrive operation for each bit line based on the result of pre-sense.

After the developing period DVL of the bit line BL-A is elapsed, the sensing operation and a strobe operation are performed to verifying for the data to be written (here, the A level).

Time T50 to T53

After the overdrive period OD within the developing period DVL, the potential of the bit line BL-A corresponding to the cell MC of the A level is converged to a certain potential V2 (for example, 0.5 V).

After the developing period DVL is elapsed, the bit line control circuit 300 performs the sensing operation in a period (hereinafter, referred to as a sensing period) SS.

At a time T50 (T5A), the bit line control circuit 300 changes the signal level of the control signal HLL from the L level to the H level. In this case, the node SEN is electrically isolated from the node SCOM by the transistor S5 to which the control signal XXL of the L level is applied. The transistor S7 is turned off by the control signal STB of the L level.

Therefore, the node SEN is charged approximately to a potential VSENP.

The bit line control circuit 300 changes the signal level of the control signal HLL from the H level to the L level at a timing when a period ensured to charge the node SEN is elapsed.

At a time T51, the bit line control circuit 300 sets the signal level of the control signal XXL as a voltage value VXXL3 (VXXL3<VXXL1). Therefore, the transistor S5 is turned on. For example, the voltage value VXXL3 is approximately 1.0 V+Vtn.

In this case, the transistors S1 and S2 are in the ON state.

Therefore, the node SEN is electrically connected to the bit line BL-A via the transistors S1, S2 and S5 of the ON state.

A current flows through the bit line BL-A according to whether or not the memory cell MC is turned on by a potential (verifying level) $V_{AV}$ of the word line WLk. The potential of the node SEN varies in accordance with the generation of the current in the bit line BL-A.

When the memory cell MC is turned on, the current flows through the bit line BL-A and the node SEN is discharged. Therefore, the potential of the node SEN is approximately the ground voltage Vss.

When the memory cell MC is turned off, the current does not flow through the bit line BL-A. In this case, the potential of the node SEN is higher than the potential (here, the voltage Vss) of the node SEN when the memory cell MC is turned on.

At a time T52, the bit line control circuit 300 transits the signal level of the control signal XXL from the H level to the L level. The transistor S5 of the OFF state electrically isolates the node SEN from the node SCOM. Therefore, the sensing operation for verifying is completed within a sensing period SS.

A result of the sensing operation with respect to the bit line is temporarily held within the node SEN.

After the control signal XXL is set as the L level, the bit line control circuit 300 changes the signal level of the control signal LPC from the L level to the H level. A voltage VHLB is applied to the bus LBUS by transistor S12 of the ON state. Therefore, the bus LBUS is charged approximately to the voltage VHLB.

After the sensing operation, the bit line control circuit 300 performs the strobe operation in a period (hereinafter, referred to as a strobe period) SB.

At a time T53, the bit line control circuit 300 changes the signal level of the control signal STB from the L level to the H level. Therefore, the transistor S7 is turned on. The potential of the bus LBUS is changed according to ON or OFF of the transistor S8 in accordance with the potential of the node SEN.

When the node SEN is in the L level (case in which the node SEN is in the discharged state), the transistor S8 is turned off. Therefore, the bus LBUS maintains the charged state and the potential of the bus LBUS is set as the H level.

When the node SEN is in the H level (case in which the node SEN is in the charged state), the transistor S8 is turned on. Therefore, the bus LBUS is electrically connected to the node CLK and the potential of the bus LBUS is changed approximately to the ground voltage Vss.

As described above, the state of the potential of the node SEN in accordance with the generation of the current in the bit line BL-A is reflected on the bus LBUS.

When the memory cell MC is turned on by the application of the verifying level $V_{AV}$, the memory cell MC has a threshold voltage equal to or less than the verifying level $V_{AV}$. In this case, a result of verifying in the memory cell MC is verify-failed (writing is not completed). The potential of the node SEN is in the L level and the potential of the bus LBUS is in the H level in the verify-failed memory cell MC.

When the memory cell MC is turned off by the application of the verifying level $V_{AV}$, the memory cell MC has a threshold voltage higher than the verifying level $V_{AV}$. In this case, a result of verifying in the memory cell MC is verify-passed (writing is completed). The potential of the node SEN is in the H level and the potential of the bus LBUS is in the L level in the verify-passed memory cell MC.

At a time T54, the bit line control circuit 300 changes the control signal STB from the H level to the L level. Therefore, the transistor S7 is turned off and the strobe operation is completed.

After the control signal STB is set as the L level, the data latch DL1 changes the signal level of the control signal STL from the L level to the H level.

Therefore, the transistor Q7a is turned on and the bus LBUS is electrically connected to the node LAT-S.

As described above, for the memory cell MC to be verified, the potential of the node LAT-S is in the H level. In this case, for the verify-failed memory cell, the potential of the bus LBUS is the same as the potential of the node LAT-S. Therefore, the node LAT-S maintains the H level.

On the other hand, for the verify-passed memory cell, the potential of the bus LBUS is in the L level. In this case, the potential of the bus LBUS is different from the potential of the node LAT-S. Therefore, the node LAT-S is discharged and the potential of the node LAT-S is changed from the H level to the L level. The potential of the node INV-S is changed from the L level to the H level in accordance with the change in the potential of the node LAT-S.

As described above, a signal (potential) on the node or bus corresponding to ON or OFF state of the memory cell MC is taken into the latch DL1 as a result of verify.

As a result, the result of verifying for the data of the A level is stored within the latch DL1.

Verify for the A level among the verifying operations is completed by the operation described above.

As illustrated in the timing chart in FIG. 7, after verifying for the A level, verifying for the B level and the C level is sequentially performed by the selective pre-charge system by substantially the same operation as the operation of verifying for the A level.

Figure 13:
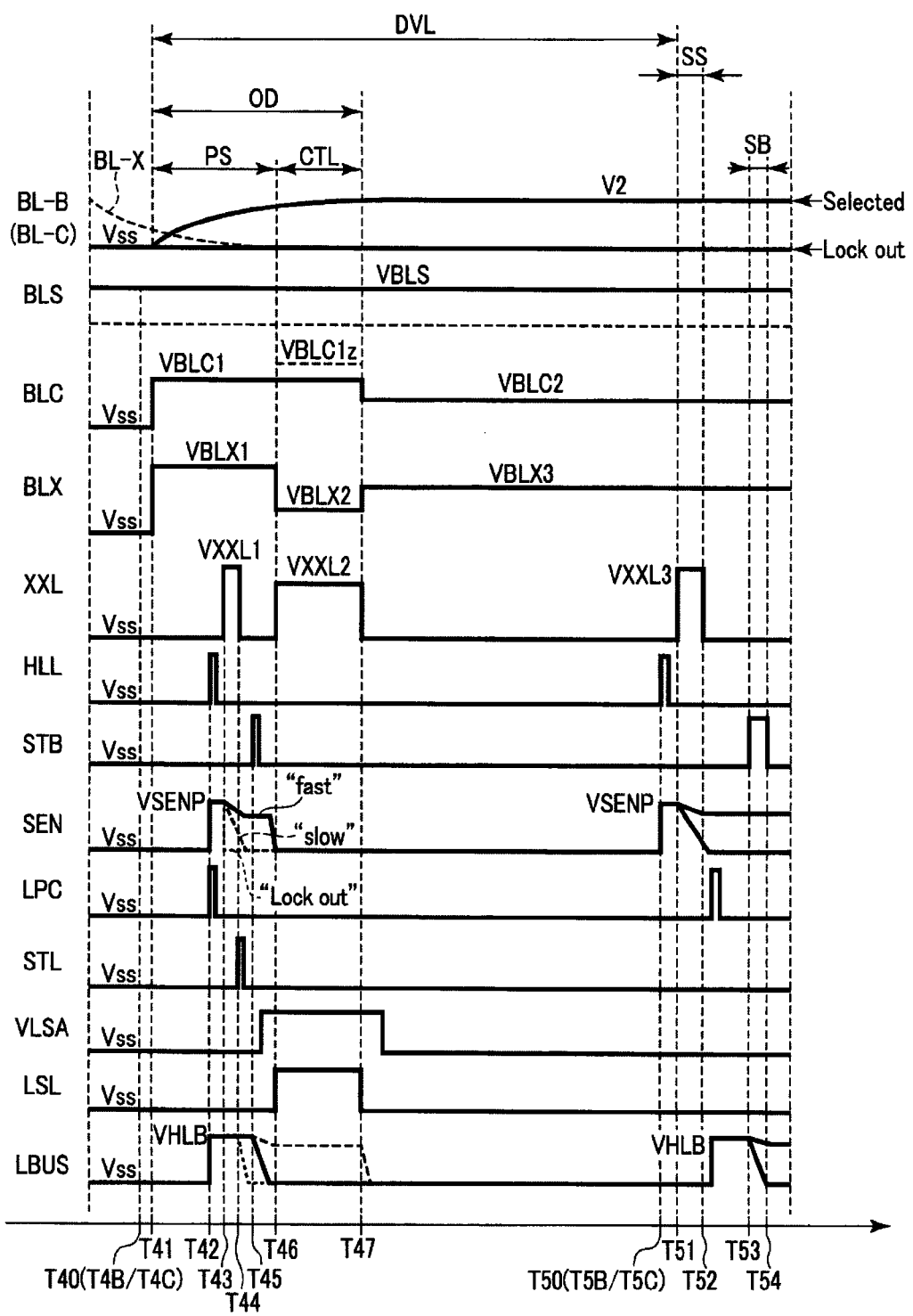
FIG. 13 is a timing chart illustrating an operation example of the memory device according to the embodiment.

As illustrated in the timing chart in FIG. 13, verifying for the B level and the C level is different from verifying of the A level in that pre-charge including the overdrive operation with respect to the bit lines BL-B (BL-C) is started in a state in which the signal level of the control signal BLS is set as the H level continuous from a verifying period of the A level.

In addition, the potential of the bit line BL-X, which is transited from the selected state to the non-selected state as the bit line BL-A of the A level, is set as the ground voltage Vss in parallel with pre-charge of the bit lines BL-B (or the bit lines BL-C).

After the verifying result for each data is acquired, when the verify-failed memory cell is included within the selected cell (or when the number of the verify-passed memory cells is less than a certain number), the sequencer 19 performs again the program operation and the verifying operation by changing setting conditions such as a voltage value of a program voltage.

When all selected cells are verify-passed (or when the number of the verify-passed memory cells is equal to or greater than a certain number), the sequencer 19 determines that the write operation with respect to a selected page is completed.

The sequencer 19 (the flash memory 1) notifies the completion of the write operation to the memory controller 5. The memory controller 5 detects the completion of writing of data of the flash memory 1 based on the notification (for example, the ready or busy signal of the H level) from the flash memory 1.

As described above, in the embodiment, writing of data of the flash memory 1 is completed.

In the flash memory according to the embodiment, for a read operation and an erasing operation, a known technique can be applied. Therefore, description of the read operation and the erasing operation of the flash memory according to the embodiment will be omitted.

In another embodiment, the determination operation is a read operation in which case the control operation of the charge of the bit line of the flash memory illustrated in FIGS. 7 to 13 is applied during the read operation of the flash memory. For example, in the read operation of the flash memory capable of reading the data of two bits, after reading of the data of the A level to which the control in FIG. 9 is applied, reading of the data of the C level to which the control in FIG. 13 is applied may be performed. As described above, the charging operation including the overdrive operation in the flash memory according to the embodiment is applied to the read operation of the data of two levels in which the determination operation is continued.

3. SUMMARY

In the charging of the bit line during the verifying operation and the read operation of the flash memory, the charging speed of the bit line may be different for each bit line according to the threshold voltage of the memory cell and mutual interference between the adjacent bit lines due to charging and discharging of the bit line.

During the charging period of a plurality of bit lines, the flash memory according to the embodiment controls the voltage used for the charging of the bit line based on the sensing result of the current value or the potential with respect to the bit line (bit line of a state in which the potential of the bit line is not converged to a certain value) during charging.

Therefore, the flash memory according to the embodiment can avoid the overcharge of the bit line of which the charging speed is fast while driving the bit line of which the charging speed is slow by the overdrive operation.

As described above, the flash memory according to the embodiment can converge the potential (charging current supplied on the bit line) of the bit line to a certain value by charging with a voltage corresponding to the charging speed for each bit line.

As a result, the flash memory according to the embodiment can make the determination operation of the threshold voltage of the memory cell faster.

In addition, the flash memory according to the embodiment can suppress occurrence of erroneous determination of the threshold voltage of the memory cell due to the overcharge of the bit line.

As a result, the flash memory according to the embodiment can improve reliability of determination of the threshold voltage of the memory cell.

As described above, the flash memory according to the embodiment can improve operation characteristics of the device.

4. OTHERS

The read operation the multi-value flash memory includes the following determination levels (reading levels).

The determination level applied to the word line selected for the read operation of the A level is, for example, between 0 V and 0.55 V. However, the determination voltage of the A level is not limited to the value and may be any one of ranges of from 0.1 V to 0.24 V, from 0.24 V to 0.31 V, from 0.31 V to 0.4 V, from 0.4 V to 0.5 V, and from 0.5 V to 0.55 V.

The determination level applied to the word line selected for the read operation of the B level is, for example, between 1.5 V and 2.3 V. However, the determination voltage of the B level is not limited to the value and may be any one of ranges of from 1.65 V to 1.8 V, from 1.8 V to 1.95 V, from 1.95 V to 2.1 V, and from 2.1 V to 2.3 V.

The determination level applied to the word line selected for the read operation of the C level is, for example, between 3.0 V and 4.0 V. The determination voltage of the C level is not limited to the value and may be any one of ranges of from 3.0 V to 3.2 V, from 3.2 V to 3.4 V, from 3.4 V to 3.5 V, from 3.5 V to 3.6 V, and from 3.6 V to 4.0 V.

In addition, a period (tR) of the read operation may be, for example, one of periods of from 25 μs to 38 μs, from 38 μs to 70 μs, and from 70 μs to 80 μs.

The write operation of the multi-value flash memory includes the program operation and the verifying operation.

In the write operation of the multi-value flash memory, a voltage initially applied to the word line that is selected during the program operation is, for example, between 13.7 V and 14.3 V. The voltage is not limited to the value and may be, for example, any one of ranges of from 13.7 V to 14.0 V and from 14.0 V to 14.6 V.

When the program operation is an incremental step pulse program (ISPP) type, a voltage of step-up is, for example, approximately 0.5 V.

An non-selected voltage (pass voltage) applied to the non-selected word line is, for example, a value of a range of from 6.0 V to 7.3 V. However, the non-selected voltage is not limited to the value and may be, for example, a value of a range of from 7.3 V to 8.4 V or may be equal to or less than 6.0 V.

The non-selected word line is an odd-numbered word line, but the voltage to be applied may be changed to an even-numbered word line.

The time (tProg) of the write operation may be, for example, any one of periods of from 1,700 μs to 1,800 μs, from 1,800 μs to 1,900 μs, and from 1,900 μs to 2,000 μs.

In the erasing operation of the multi-value flash memory, the voltage initially applied to the well region that is formed on an upper portion of the semiconductor substrate and arranged where the memory cell is arranged above is, for example, a value of a range of 12 V to 13.6 V. The voltage is not limited to the value and may be, for example, any one of ranges of from 13.6 V to 14.8 V, from 14.8 V to 19.0 V, from 19.0 V to 19.8 V and from 19.8 V to 21 V.

The time (tErase) of the erasing operation may be, for example, any one of periods of from 3,000 μs to 4,000 μs, from 4,000 μs to 5,000 μs, and from 5,000 μs to 9,000 μs.

The memory cell has a charge storage layer arranged on the side surface of the semiconductor pillar via a tunnel insulating film of from 4 nm to 10 nm. The charge storage layer may be a stacked structure of an insulating film (for example, SiN or SiON, and the like) having a film thickness of from 2 nm to 3 nm and polysilicon of a film thickness of from 3 nm to 8 nm. In addition, the polysilicon may contain metal such as Ru.

The insulating film is provided on the charge storage layer. The insulating film includes, for example, a lower High-k film having a film thickness of from 3 nm to 10 nm, an upper High-k film having a film thickness of from 3 nm to 10 nm, and a silicon oxide film having a film thickness of from 4 nm to 10 nm interposed between the lower and upper High-k films. The High-k film includes a film such as HfO. In addition, the film thickness of the silicon oxide film may be thicker than the film thickness of the High-k film.

A control gate electrode having a film thickness of from 30 nm to 70 nm on the insulating film via a material having a film thickness of from 3 nm to 10 nm. The material is a metal oxide film such as TaO and a metal nitride film such as TaN. The control gate electrode may be metal such as tungsten (W).

An air gap may be provided between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   memory cells;
   word lines that are each connected to gates of a plurality of the memory cells;
   bit lines that are each connected to a plurality of the memory cells; and
   a control circuit configured to perform a determination operation on the memory cells,
   wherein during the determination operation for a first memory cell among the memory cells, a first bit line connected to the first memory cell is charged to a target voltage using a bit line charge voltage, which is adjusted based on a result of a first sensing operation that is performed on the first bit line during the charging of the first bit line to the target voltage, and a second sensing operation is performed on the first bit line after completion of the charging of the first bit line to the target voltage to determine whether a threshold voltage of the first memory cell is greater than a reference voltage.

2. The device according to claim 1, wherein the bit line charge voltage is adjusted to a first voltage if the first sensing operation generates a first result and adjusted to a second voltage higher than the first voltage if the first sensing operation generates a second result.

3. The device according to claim 2, further comprising: a sense amplifier circuit including a bit line control circuit, a plurality data latches, and a wiring between the bit line control circuit and the data latches, wherein the wiring is at a low voltage level if the first sensing operation generates the first result and the wiring is at a high voltage level if the first sensing operation generates the second result.

4. The device according to claim 3, wherein the bit line control circuit includes a first transistor between a first voltage source and a bit line charging node, and a second transistor between a second voltage source and the bit line charging node, wherein the second voltage source supplies voltage at a lower level than the first voltage source, and wherein the first transistor is turned off and the second transistor is turned on, if the wiring is at the low voltage level, and the first transistor is turned on and the second transistor is turned off, if the wiring is at the high voltage level.

5. The device according to claim 4, wherein the bit line control circuit further includes a third transistor between the first transistor and the bit line charging node, the third transistor being turned on and a gate voltage supplied to the second transistor being lowered to cause an adjustment of the bit line charge voltage.

6. The device according to claim 1, wherein the control circuit is configured to perform the determination operation during a verify operation.

7. The device according to claim 1, wherein the control circuit is configured to perform the determination operation during a read operation.

8. A memory device comprising:

memory cells including a first memory cell;

word lines that are each connected to gates of a plurality of the memory cells;

bit lines that are each connected to a plurality of the memory cells; and a control circuit configured to perform a bit line pre-charge operation during a determination operation on the memory cells, wherein during the bit line pre-charge operation on a first bit line connected to the first memory cell, the first bit line is initially charged using an initial bit line charge voltage, and before completion of the bit line pre-charge operation, a sensing operation is performed on the first bit line to determine a new bit line charge voltage based on a result of the sensing operation, and then the bit line pre-charge operation is completed using the new bit line charge voltage.

9. The device according to claim 8, wherein the initial bit line charge voltage is applied during a first period of the bit line pre-charge operation and the new bit line charge voltage is applied during a second period of the bit line pre-charge operation that is after the first period.

10. The device according to claim 9, wherein the new bit line charge voltage is greater than the initial bit line charge voltage if the sensing operation indicates that the first bit line is below a first voltage level.

11. The device according to claim 9, wherein the new bit line charge voltage is less than or equal to the initial bit line charge voltage if the sensing operation indicates that the first bit line is above a first voltage level.

12. The device according to claim 8, wherein the controller is configured to perform another sensing operation on the first bit line after completion of the bit line charge operation.

13. The device according to claim 12, wherein said another sensing operation on the first bit line is carried out to determine whether or not the first memory cell has a threshold voltage that is higher than a reference voltage.

14. A memory device comprising:

memory cells;

a bit line that is connected to a plurality of the memory cells;

a sense amplifier configured to perform a sense operation on the bit line; and a control circuit configured to control the sense amplifier during a bit line pre-charge operation on the memory cells, wherein the sense amplifier includes a bit line control circuit and the bit line control circuit includes a first transistor between a first voltage source and a bit line charging node, and a second transistor between a second voltage source and the bit line charging node, the second voltage source supplying voltage at a lower level than the first voltage source, and during the bit line pre-charge operation that includes a first period and a second period after the first period:

a first voltage is applied to the second transistor in the first period and a second voltage lower than the first voltage is applied to the second transistor in the second period, and a third voltage is applied to the first transistor at the beginning of the first period, while a fourth voltage higher than the third voltage is applied to the first transistor during a sensing operation that is carried out during the first period, and a fifth voltage higher than the third voltage and lower than the fourth voltage is applied to the first transistor in the second period.

15. The memory device according to claim 14, wherein the sense amplifier further includes data latches and a wiring between the bit line control circuit and the data latches, and the bit line control circuit further includes a third transistor between the first voltage source and the second transistor, the third transistor being controlled according to a voltage level of the wiring.

16. The memory device according to claim 15, wherein the bit line control circuit further includes a sense node, and a voltage level of the sense node that is sensed during the sensing operation causes the voltage level of the wiring to be at a high level or a low level.

17. The memory device according to claim 16, wherein the control circuit is configured to perform another sensing operation after the bit line pre-charge operation.

18. The memory device according to claim 16, wherein said another sensing operation is performed in connection with a verify operation.

19. The memory device according to claim 16, wherein said another sensing operation is performed in connection with a read operation.

\* \* \* \* \*